(12) United States Patent
Liu et al.

(10) Patent No.: US 10,943,843 B2
(45) Date of Patent: Mar. 9, 2021

(54) SEMICONDUCTOR PACKAGE STRUCTURE

(71) Applicant: Advanced Semiconductor Engineering, Inc., Kaohsiung (TW)

(72) Inventors: Hsiu-Chi Liu, Kaohsiung (TW); Hsu-Nan Fang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/241,589

(22) Filed: Jan. 7, 2019

(65) Prior Publication Data

US 2020/0219845 A1 Jul. 9, 2020

(51) Int. Cl.
| | | |
|---|---|---|
| H01L 23/31 | (2006.01) | |
| H01L 25/065 | (2006.01) | |
| H01L 23/538 | (2006.01) | |
| H01L 23/00 | (2006.01) | |
| H01L 21/768 | (2006.01) | |
| H01L 21/56 | (2006.01) | |
| H01L 23/498 | (2006.01) | |

(52) U.S. Cl.
CPC ........ *H01L 23/3121* (2013.01); *H01L 21/563* (2013.01); *H01L 21/565* (2013.01); *H01L 21/76874* (2013.01); *H01L 23/3107* (2013.01); *H01L 23/3128* (2013.01); *H01L 23/3135* (2013.01); *H01L 23/3157* (2013.01); *H01L 23/49833* (2013.01); *H01L 23/5386* (2013.01); *H01L 23/5389* (2013.01); *H01L 24/09* (2013.01); *H01L 24/17* (2013.01); *H01L 24/96* (2013.01); *H01L 25/0655* (2013.01); *H01L 2224/02373* (2013.01)

(58) Field of Classification Search
CPC ........... H01L 25/0655; H01L 21/76874; H01L 23/3157; H01L 21/565; H01L 23/3128; H01L 24/17; H01L 24/09; H01L 21/563; H01L 23/5386; H01L 2224/02373; H01L 21/568; H01L 23/3107; H01L 23/3135; H01L 23/5389; H01L 23/3121; H01L 24/96; H01L 23/49833; H01L 23/49861; H01L 23/315; H01L 23/28
See application file for complete search history.

(56) References Cited

U.S. PATENT DOCUMENTS

| | | | |
|---|---|---|---|
| 9,653,411 B1 | 5/2017 | Lu et al. | |
| 10,276,510 B2* | 4/2019 | Chiang | H01L 23/3128 |
| 2008/0099910 A1* | 5/2008 | McLellan | H01L 23/16 257/723 |
| 2013/0256922 A1* | 10/2013 | Bauer | H01L 23/293 257/787 |
| 2016/0181218 A1* | 6/2016 | Karhade | H01L 25/0657 257/737 |
| 2016/0276238 A1 | 9/2016 | Lin et al. | |
| 2017/0271272 A1* | 9/2017 | Lee | H01L 21/486 |

\* cited by examiner

*Primary Examiner* — Shouxiang Hu
(74) *Attorney, Agent, or Firm* — Foley & Lardner LLP

(57) ABSTRACT

A semiconductor package structure includes a conductive trace layer, a semiconductor die over the conductive trace layer, a structure enhancement layer surrounding the semiconductor die, and an encapsulant covering the semiconductor die and the structure enhancement layer. The structure enhancement layer coincides with a mass center plane of the semiconductor package structure. The mass center plane is parallel to a top surface of the semiconductor die. A method for manufacturing the semiconductor package structure is also provided.

19 Claims, 34 Drawing Sheets

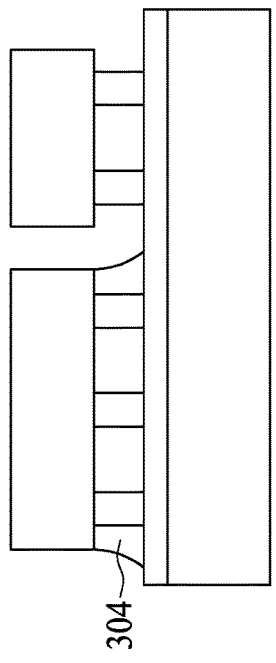
FIG. 5D
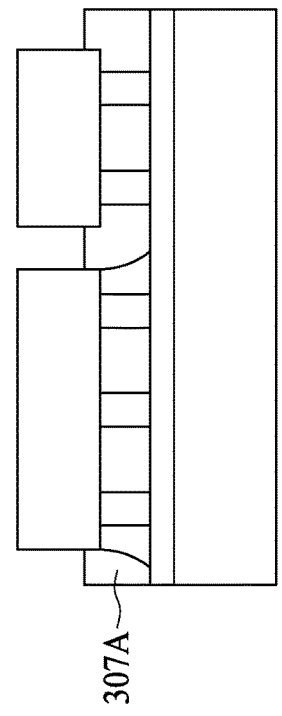
FIG. 5E
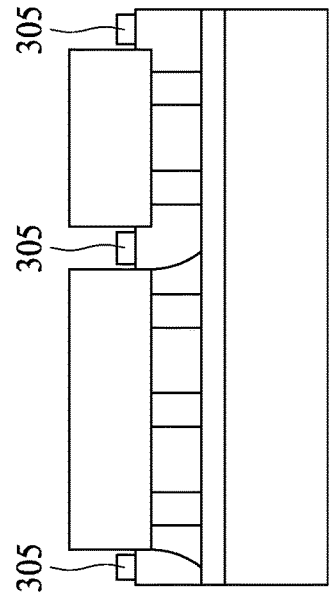
FIG. 5F
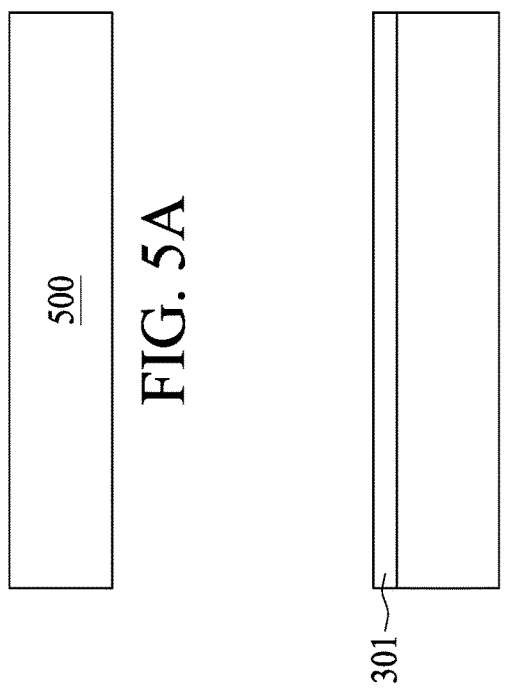
FIG. 5A
FIG. 5B
FIG. 5C

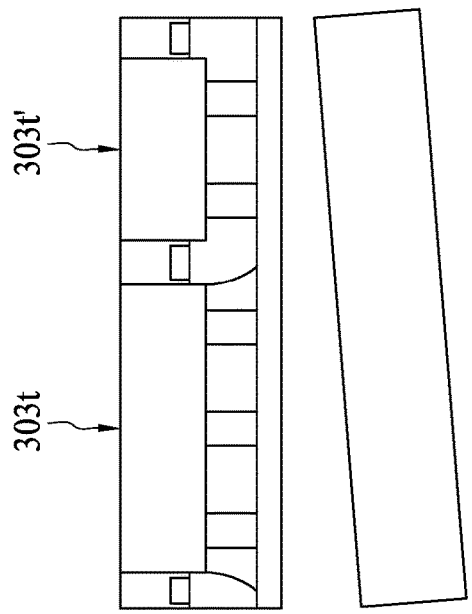
FIG. 5I
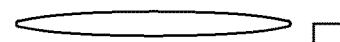
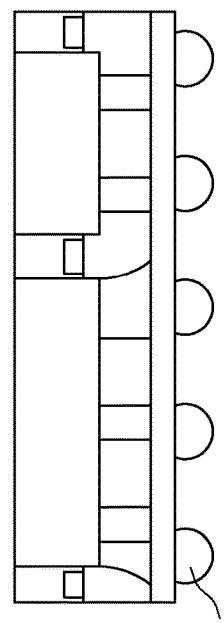
FIG. 5J
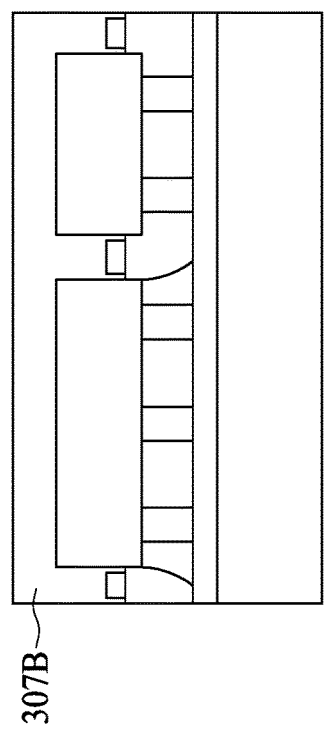
FIG. 5G
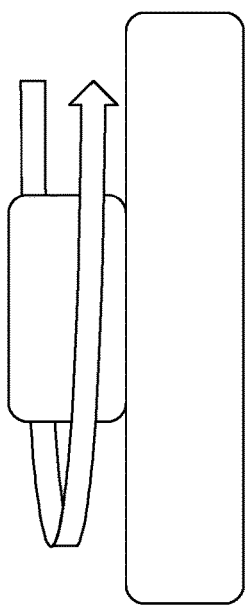
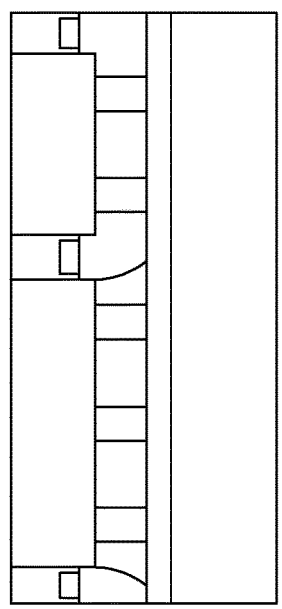
FIG. 5H

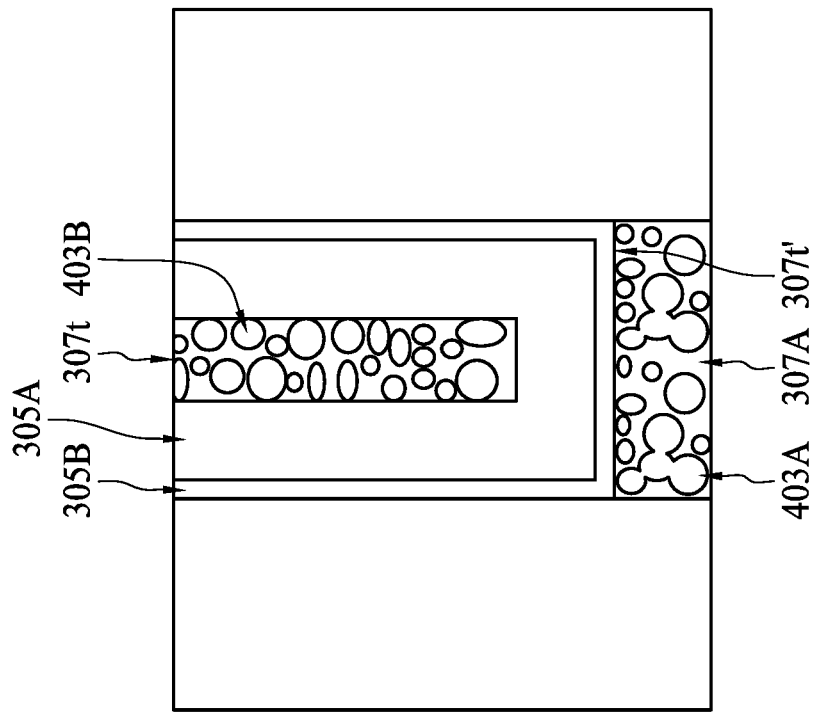
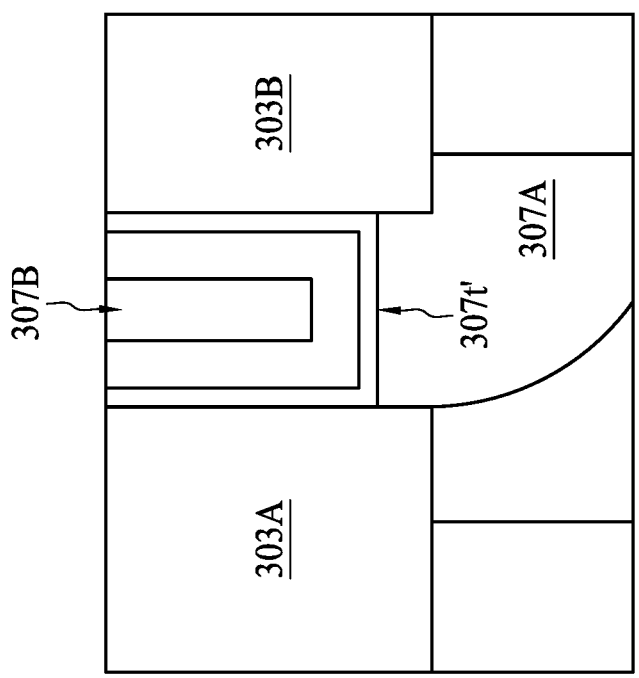
FIG. 7B
FIG. 7A

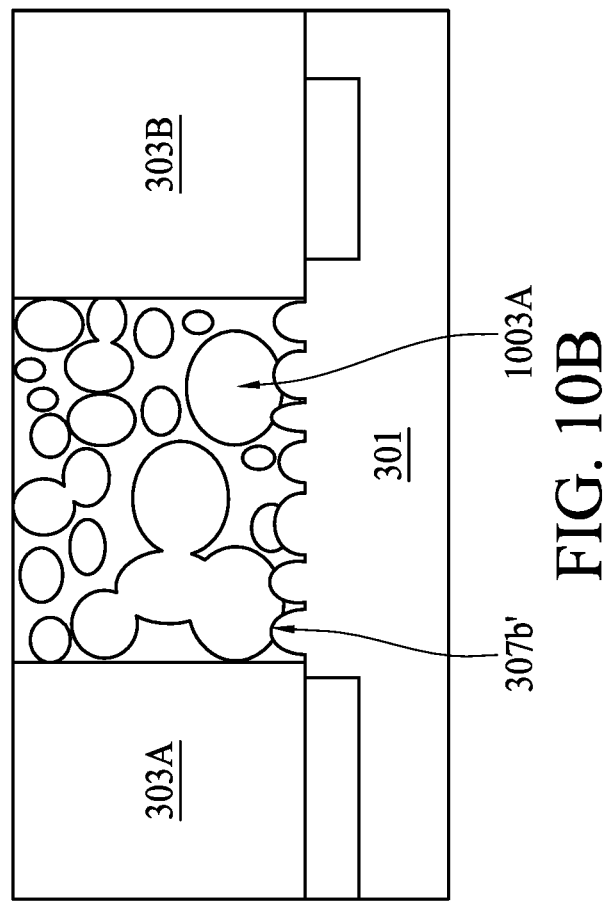
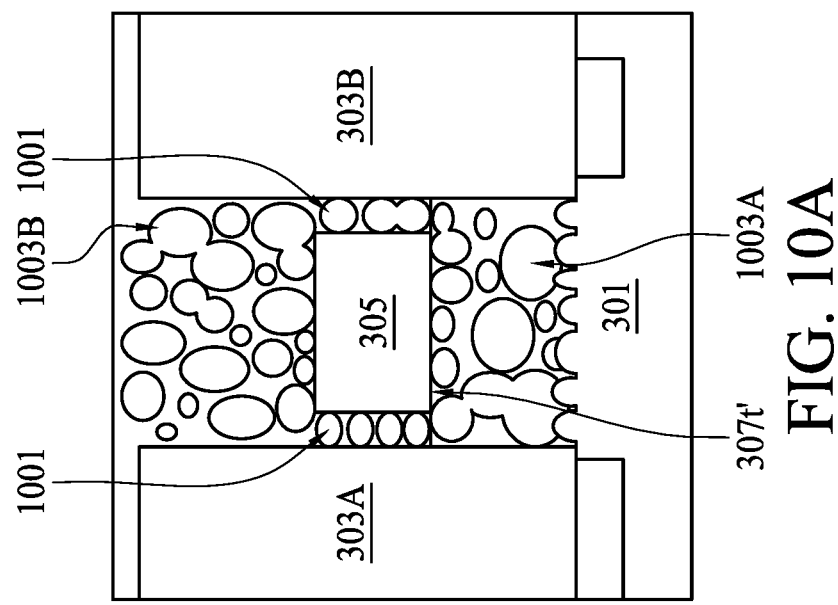

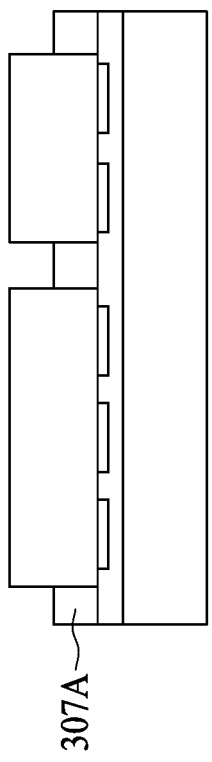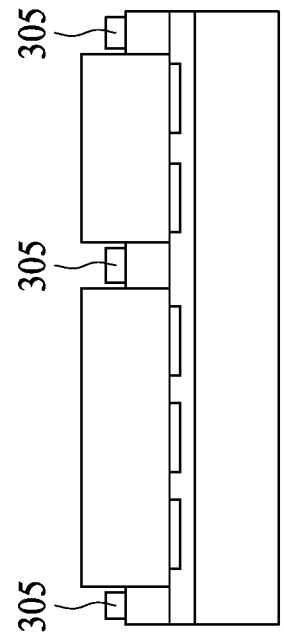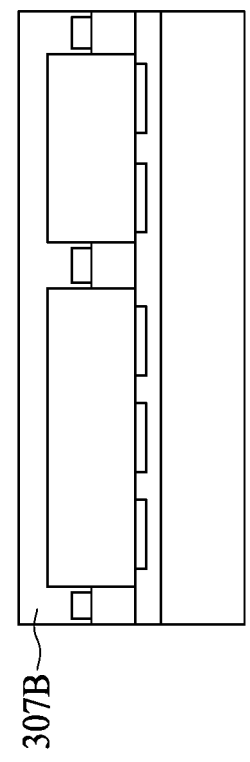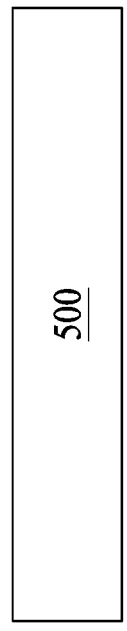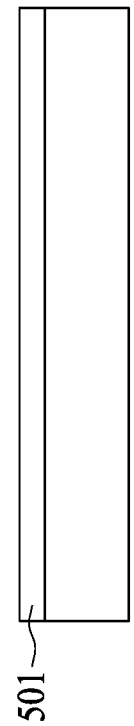

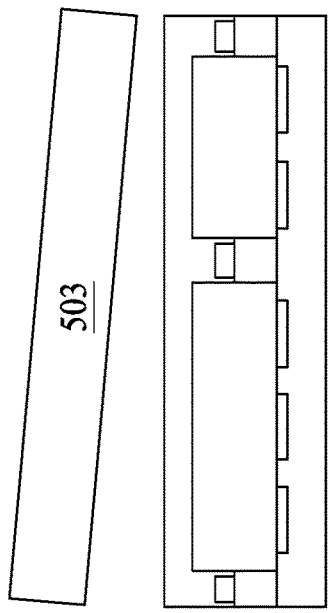
FIG. 11G
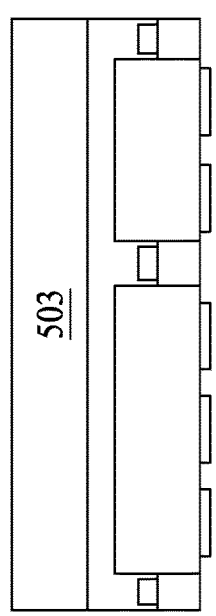
FIG. 11H
FIG. 11I
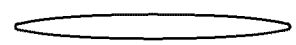
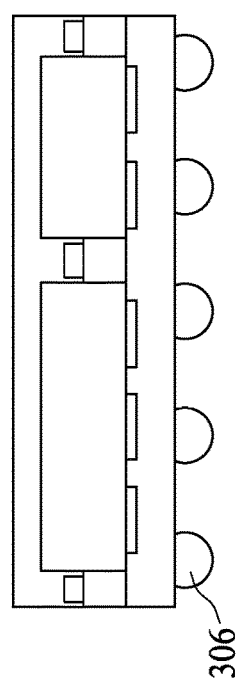
FIG. 11J
FIG. 11K

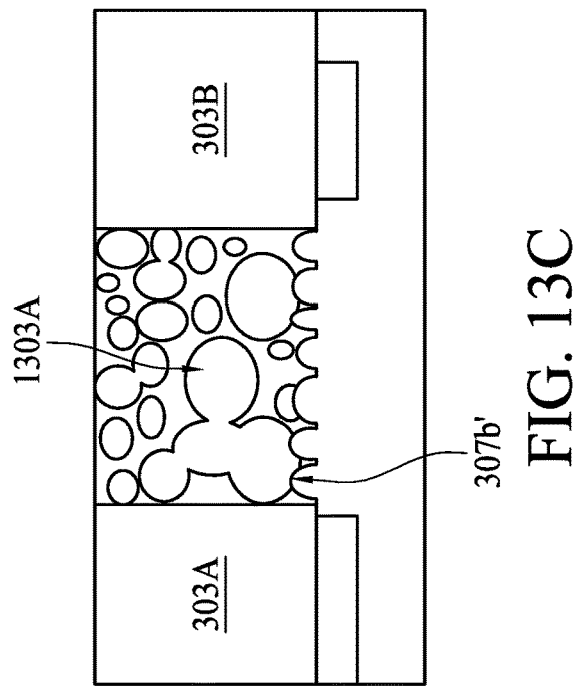
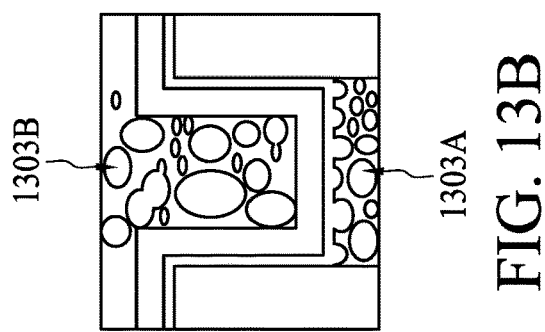
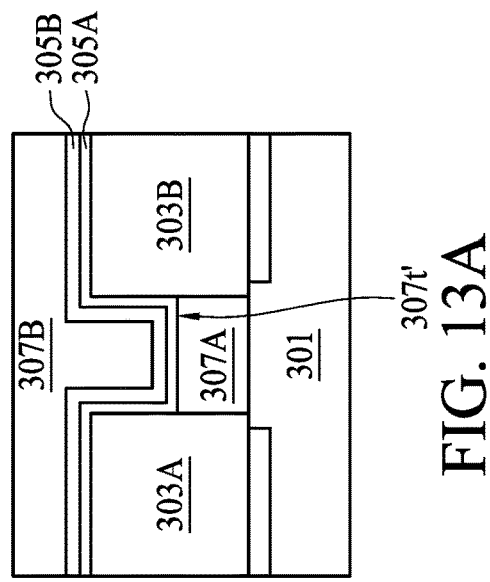
FIG. 13C
FIG. 13B
FIG. 13A

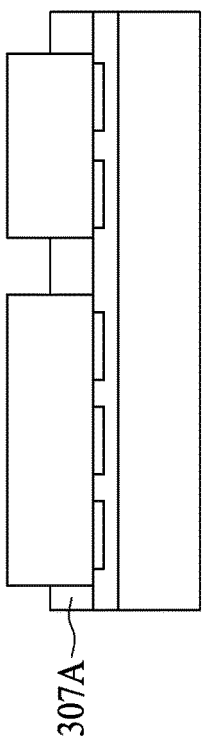
FIG. 14D
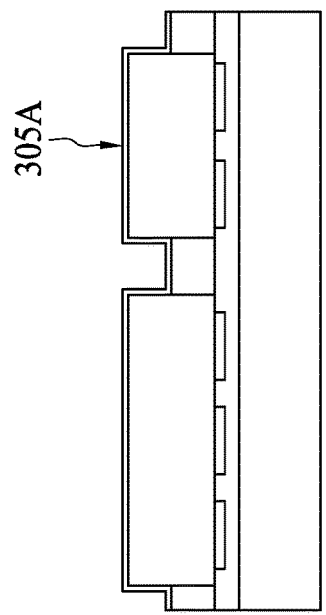
FIG. 14E
FIG. 14F
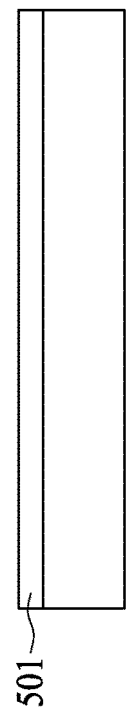
FIG. 14A
FIG. 14B
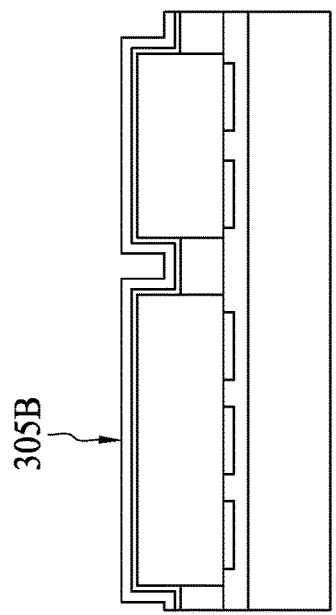
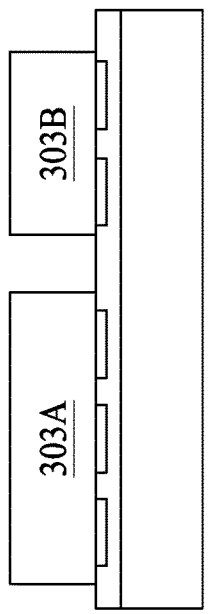
FIG. 14C

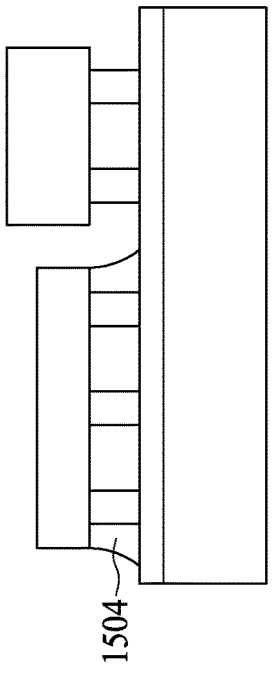
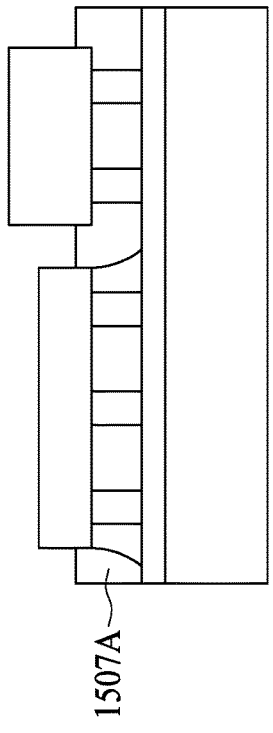
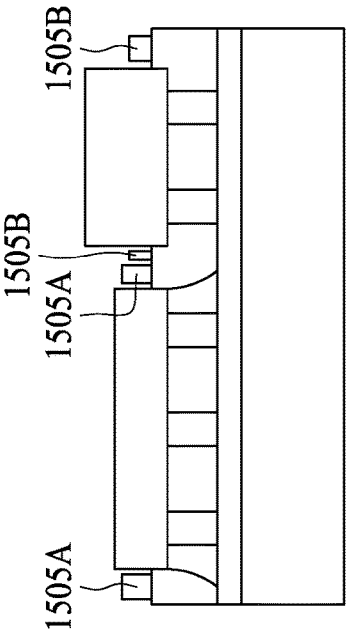
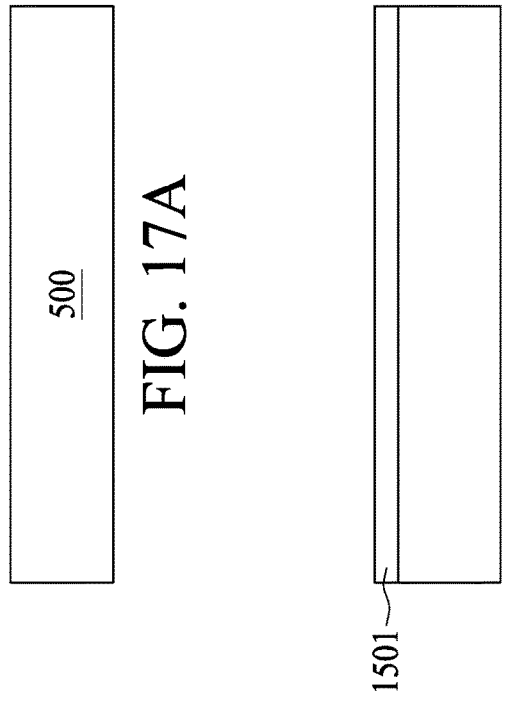
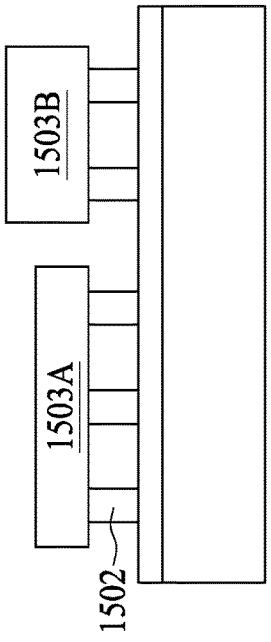

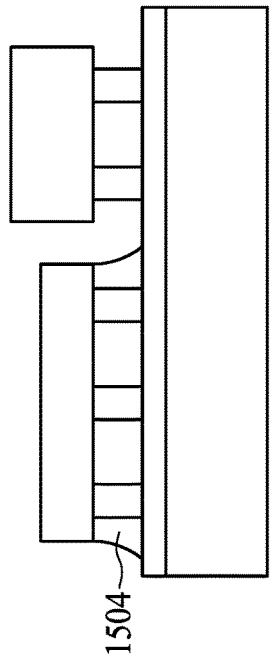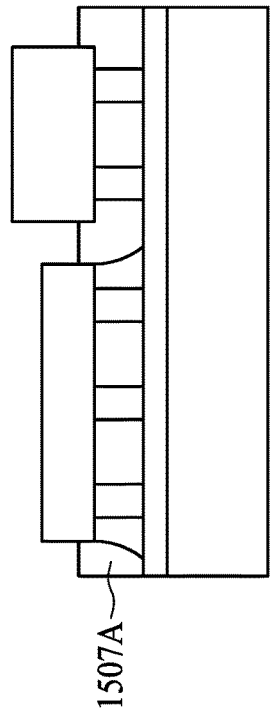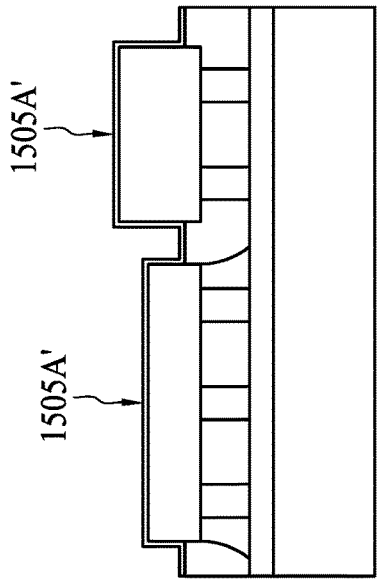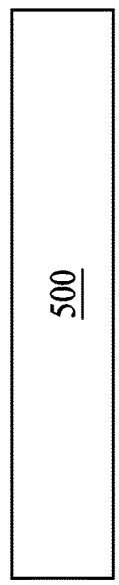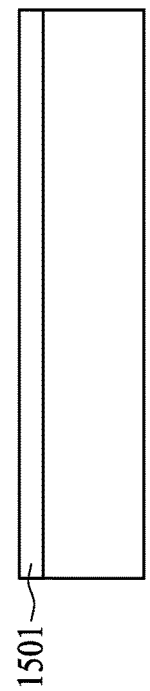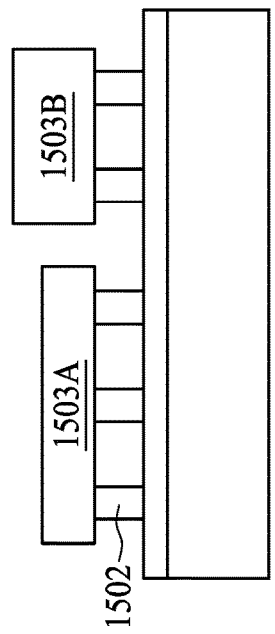

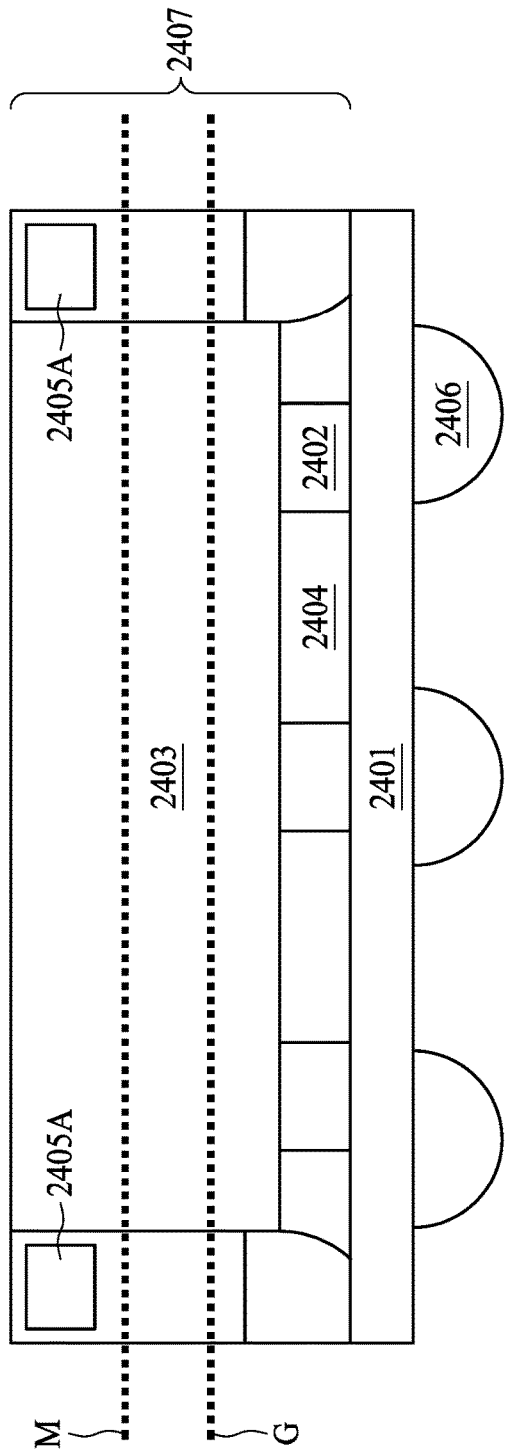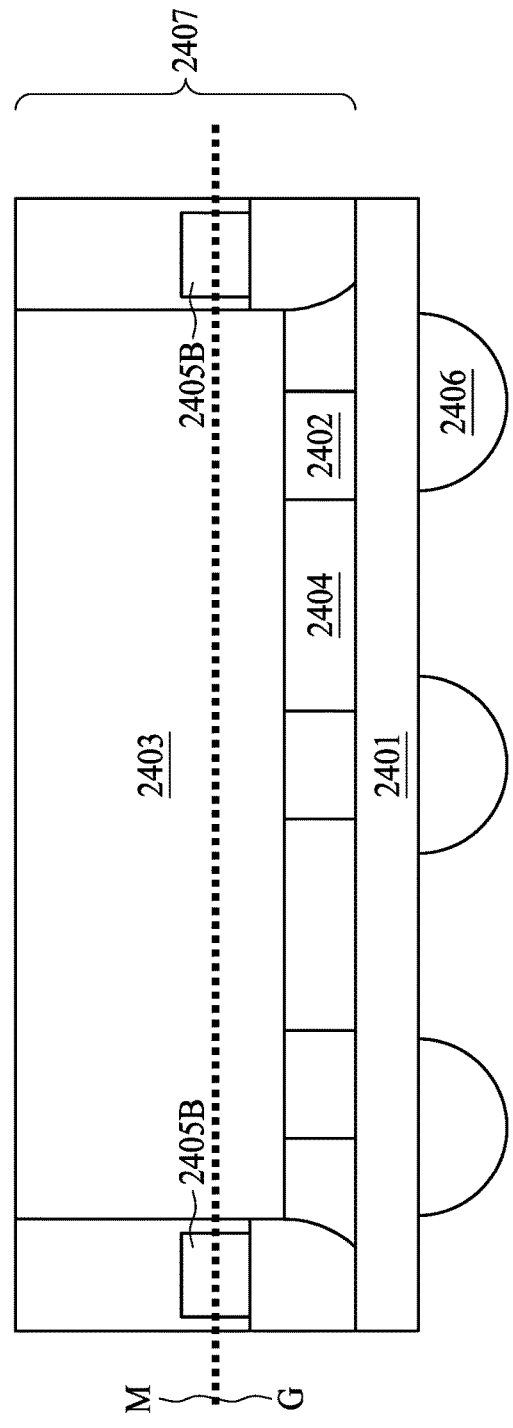
FIG. 24A
FIG. 24B

US 10,943,843 B2

SEMICONDUCTOR PACKAGE STRUCTURE

BACKGROUND

1. Technical Field

The present disclosure relates to a semiconductor package structure having a structure enhancement layer.

2. Description of the Related Art

Chip Last Fan Out is a packaging technique restructuring the I/O pads on a semiconductor chip by RDL routing to form a conductive pattern layer having wider line spaces. An RDL is often made of metal and dielectric layers at the surface of the semiconductor chip. In wafer-level packaging, a rather thick molding compound will be disposed on the surface of the semiconductor chip which is supported by a glass carrier. Due to the coefficient of thermal expansion (CTE) of the molding compound and that of the RDL being different, or the structure mass is imbalanced, warpage or deformation of the semiconductor package could occur.

In a comparative approach, an RDL in Chip Last Fan Out is supported by a glass carrier, and the CTE of the glass carrier and that of the RDL is 3 ppm/C and 60 ppm/C, respectively. The package warps in a concave manner after the formation of the RDL on the glass carrier. In order to balance the structure mass, a molding compound having a CTE of about 8 ppm/C, which is close to the CTE of the glass carrier, is selected to form over the RDL. However, after a de-carrier operation, due to the CTE of the RDL being substantially greater than the CTE of the molding compound, the package warps in a convex manner, inhibiting the subsequent packaging procedures. In order to resolve the aforesaid problem, a molding compound with a greater CTE (e.g., 60 ppm/C), or with a CTE close to that of the RDL, is selected. Nevertheless, applying such molding compound will exacerbate the concave behavior of the package prior to the de-carrier operation. The wafer may break and abnormal handling issues may occur, increasing the difficulty of the de-carrier operation.

SUMMARY

Some embodiments provide a structure enhancement layer in a semiconductor package structure. The structure enhancement layer surrounds a semiconductor chip. A position of the structure enhancement layer, from a cross sectional view, is determined by first identifying a geometric center, from a cross sectional view, of the final package structure, thereby calculating the position of the structure enhancement layer such that a mass center of the final package structure including such structure enhancement layer coincides with the previously identified geometric center. Introduction of such structure enhancement layer can simultaneously inhibit the concave and convex warpage behavior and effectively enhance the strength and stiffness of the semiconductor package in order to achieve structure mass balance.

Some embodiments of the present disclosure provide a semiconductor package structure, including a conductive trace layer, a semiconductor die over the conductive trace layer, a structure enhancement layer surrounding the semiconductor die, and an encapsulant covering the semiconductor die and the structure enhancement layer. A top surface of the structure enhancement layer is lower than a top surface of the semiconductor die.

Some embodiments of the present disclosure provide a semiconductor package structure, including a conductive trace layer, a first semiconductor die electrically coupled to the conductive trace layer, a first structure enhancement layer surrounding a sidewall of the first semiconductor die; and an encapsulant covering the first semiconductor die and the first structure enhancement layer. A top surface of the first semiconductor die is exposed from the encapsulant.

Some embodiments of the present disclosure provide a method for manufacturing a semiconductor package structure. The method includes providing a conductive trace layer, disposing a semiconductor die over the conductive trace layer, and placing a structure enhancement layer at a mass center plane of the semiconductor package structure and around the semiconductor die.

BRIEF DESCRIPTION OF THE DRAWINGS

FIG. 5A, FIG. 5B, FIG. 5C, FIG. 5D, FIG. 5E, FIG. 5F, FIG. 5G, FIG. 5H, FIG. 5I, and FIG. 5J are cross-sectional views of a semiconductor package structure during various intermediate manufacturing operations, in accordance with some embodiments of the present disclosure.

FIG. 7A is an enlarged view of a portion of the semiconductor package structure in FIG. 6, according to some embodiments of the present disclosure.

FIG. 7B is an enlarged view of a portion of the semiconductor package structure in FIG. 6, according to some embodiments of the present disclosure.

FIG. 10A is an enlarged view of a portion of the semiconductor package structure in FIG. 9, according to some embodiments of the present disclosure.

FIG. 10B is an enlarged view of a portion of the semiconductor package structure in FIG. 9, according to some embodiments of the present disclosure.

FIG. 11A, FIG. 11B, FIG. 11C, FIG. 11D, FIG. 11E, FIG. 11F, FIG. 11G, FIG. 11H, FIG. 11I, FIG. 11J, and FIG. 11K are cross-sectional views of a semiconductor package structure during various intermediate manufacturing operations, in accordance with some embodiments of the present disclosure.

FIG. 13A is an enlarged view of a portion of the semiconductor package structure in FIG. 12, according to some embodiments of the present disclosure.

FIG. 13B is an enlarged view of a portion of the semiconductor package structure in FIG. 12, according to some embodiments of the present disclosure.

FIG. 13C is an enlarged view of a portion of the semiconductor package structure in FIG. 12, according to some embodiments of the present disclosure.

FIG. 14A, FIG. 14B, FIG. 14C, FIG. 14D, FIG. 14E, FIG. 14F, FIG. 14G, FIG. 14H, FIG. 14I, FIG. 14J, FIG. 14K, and FIG. 14L are cross-sectional views of a semiconductor package structure during various intermediate manufacturing operations, in accordance with some embodiments of the present disclosure.

FIG. 17A, FIG. 17B, FIG. 17C, FIG. 17D, FIG. 17E, FIG. 17F, FIG. 17G, FIG. 17H, FIG. 17I, and FIG. 17J are cross-sectional views of a semiconductor package structure during various intermediate manufacturing operations, in accordance with some embodiments of the present disclosure.

FIG. 20A, FIG. 20B, FIG. 20C, FIG. 20D, FIG. 20E, FIG. 20F, FIG. 20G, FIG. 20H, FIG. 20I, FIG. 20J, FIG. 20K, and FIG. 20L are cross-sectional views of a semiconductor package structure during various intermediate manufacturing operations, in accordance with some embodiments of the present disclosure.

FIG. 23 and FIG. 24A are cross sectional views of a semiconductor package structure, in accordance with some comparative embodiments of the present disclosure.

FIG. 24B and FIG. 25 are cross sectional views of a semiconductor package structure, in accordance with some embodiments of the present disclosure.

DETAILED DESCRIPTION

Figure 1:
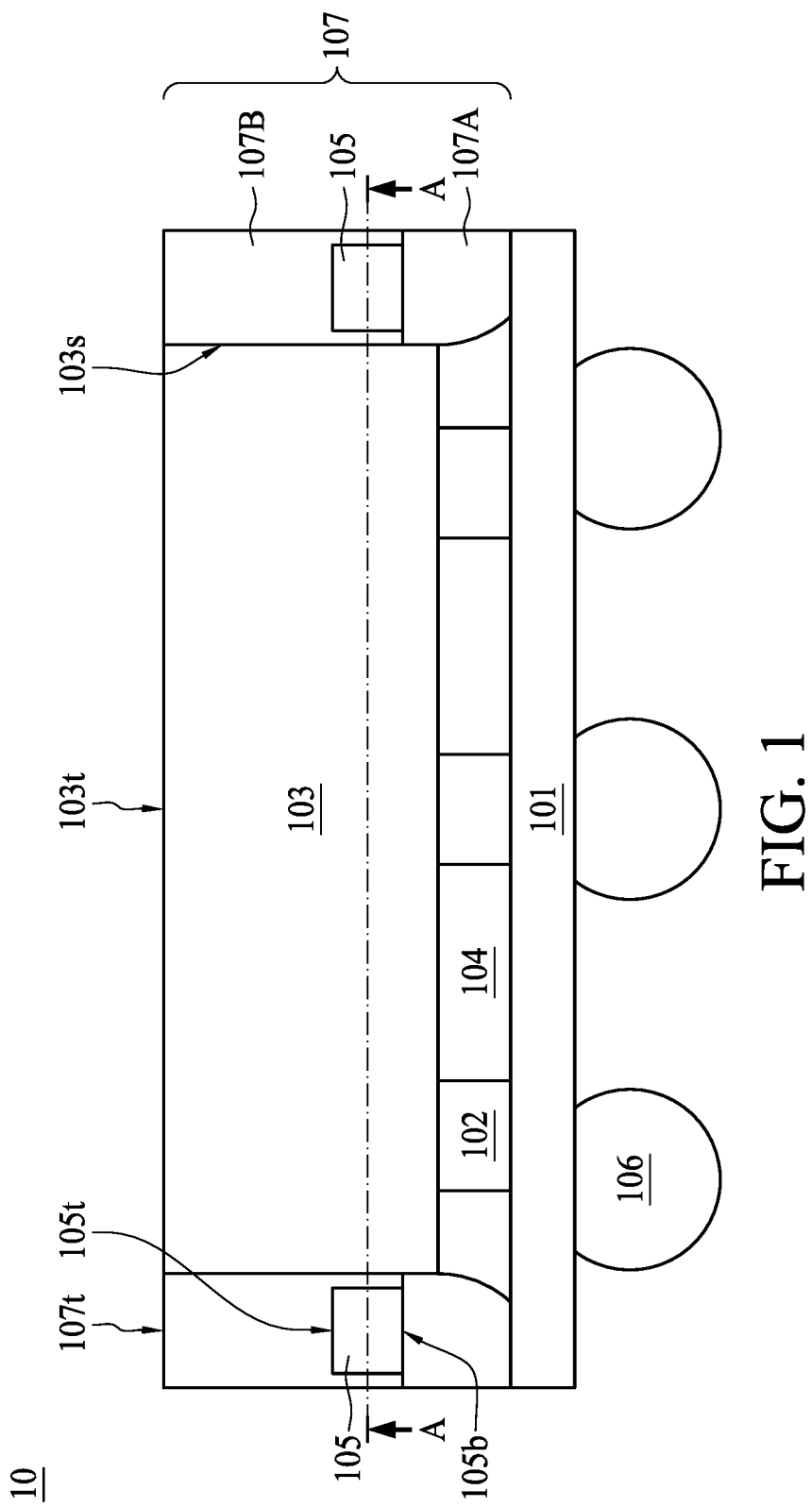
FIG. 1 is a cross-sectional view of a semiconductor package structure, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Referring to FIG. 1, FIG. 1 is a cross-sectional view of a semiconductor package structure 10, according to some embodiments of the present disclosure. The semiconductor package structure 10 includes a semiconductor die 103 positioned over a conductive trace layer 101. The semiconductor die 103 is surrounded by a structure enhancement layer 105 from a sidewall 103S of the semiconductor die 103. An encapsulant 107 covers the semiconductor die 103 and the structure enhancement layer 105, as well as the conductive trace layer 101. In some embodiments, the conductive trace layer 101 is composed of dielectric material, polymeric material, conductive material, and/or passivation material. The conductive material may be routed and embedded in the dielectric material, polymeric material, or passivation material. In some embodiments, the conductive trace layer 101 can be a redistribution layer (RDL) with one side connected to conductive terminals 106, such as solder bumps, and the opposite side electrically coupled to the semiconductor die 103.

In some embodiments, the semiconductor die 103 is connected to a top surface of the conductive trace layer 101 through one or a plurality of conductive bumps 102. Underfill material 104 surrounds the conductive bumps 102 and is positioned between the bottom of the semiconductor die 103 and the top of the conductive trace layer 101.

In some embodiments, the encapsulant 107 includes a first portion 107A underlying the structure enhancement layer 105 and a second portion 107B above the structure enhancement layer 105. A bottom surface 105b of the structure enhancement layer 105 is in contact with a top surface of the first portion 107A of the encapsulant 107. The structure enhancement layer 105 includes a top surface 105t, which can be covered by the second portion 107B of the encapsulant 107. As shown in FIG. 1, a top surface 103t of the semiconductor die 103 is exposed from the second portion 107B of the encapsulant 107. In some embodiments, the top surface 103t of the semiconductor die 103 is coplanar with a top surface of the second portion 107B of the encapsulant 107. The top surface 103t of the semiconductor die 103 is exposed from a top surface of the second portion 107B of the encapsulant 107. In the current embodiment, because the structure enhancement layer 105 is embedded between the first portion 107A and the second portion 107B, the top surface 105t of the structure enhancement layer 105 is lower than the top surface 103t of the semiconductor die 103.

In some embodiments, the structure enhancement layer 105 is a pre-cut film of desired dimension and thickness. The structure enhancement layer 105 can be composed of metal, for example, stainless steel, or fiber-reinforced plastic, for example, fiberglass. Selection of the structure enhancement layer 105 can be considered at least from a material stiffness perspective and from a manufacturing applicability perspective. For instance, stiffness of the structure enhancement layer 105 shall be greater than the stiffness of any major components in the semiconductor package structure 10, thereby enhancing the mechanical strength of the semiconductor package. For example, the stiffness of the structure enhancement layer 105 is greater than the stiffness of the conductive trace layer 101, the encapsulant 107, and the semiconductor die 103. In some embodiments, the structure enhancement layer 105 may be a patterned flexible film, which can be easily applied over the conductive trace layer 101 by a laminating operation without contacting the semiconductor die 103. The patterned flexible film may have a plurality of openings adapted to a planar contour of the semiconductor die 103, such that when applying the structure enhancement layer 105 to surround the semiconductor die 103, the structure enhancement layer 105 may not be in contact with the sidewall 103s or the top surface 103t of the semiconductor die 103, and a space between the sidewall 103s and the structure enhancement layer 105 may be preserved. Such space can be filled by the encapsulant 107 in subsequent operations. For example, as illustrated in FIG. 1, the structure enhancement layer 105 is positioned on the first portion 107A of the encapsulant 107, and the space between the sidewall 103s of the semiconductor die 103 and the structure enhancement layer 105 is filled with the second portion 107B of the encapsulant 107. In some embodiments, the structure enhancement layer can be directly positioned over the conductive trace layer, as will be discussed in FIG. 25 of the present disclosure.

The semiconductor package structure 10 possesses a geometric center plane, which is a plane parallel to the top surface 103t of the semiconductor die 103 and located at a geometric center of the package structure from a cross sectional view perspective. Normally, the geometric center plane is situated at half of the package height. The semiconductor package structure 10 possesses a mass center plane, which is also a plane parallel to the top surface 103t of the semiconductor die 103 and located at a mass center of the package structure from a cross sectional view perspective. Normally, the mass center plane can be determined by accounting for densities of major components in the package structure, and may be located anywhere between the top and the bottom of the package structure. In some embodiments, the geometric center plane coincides with the mass center plane of the semiconductor package structure 10, in order to effectively strengthen the mechanical strength of the semiconductor package and alleviate the warpage problem as previously addressed.

Figure 2:
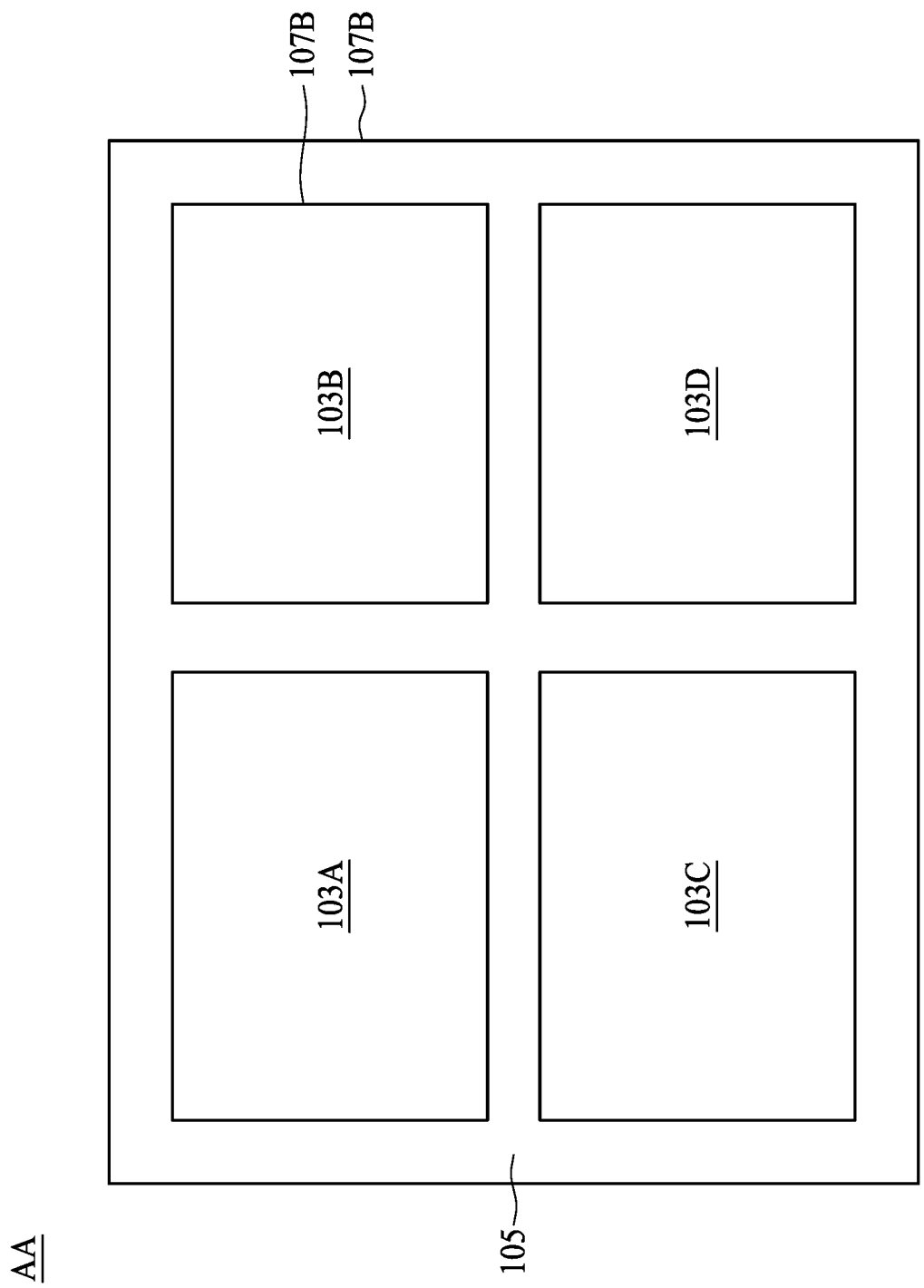
FIG. 2 is a top view of the semiconductor package structure of FIG. 1, dissecting along plane AA, according to some embodiments of the present disclosure

Referring to FIG. 2, FIG. 2 is a top view of the semiconductor package structure 10 of FIG. 1 dissecting along plane AA, according to some embodiments of the present disclosure. From a top view perspective, a first semiconductor die 103A, a second semiconductor die 103B, a third semiconductor die 103C, and a fourth semiconductor die 103D (hereinafter "semiconductor dies") are surrounded by the structure enhancement layer 105. The space between the semiconductor dies and the structure enhancement layer 105 is filled by the encapsulant 107, or in this case, the second portion 107B of the encapsulant. In some embodiments, the second portion 107B of the encapsulant further surrounds the structure enhancement layer 105. In some embodiments, the structure enhancement layer 105 occupies a continuous region surrounding each of the semiconductor dies, so as to provide sufficient mechanical strengthening to the semiconductor package structure. However, other arrangements of the structure enhancement layer are also applicable as long as the stiffness of the semiconductor package can be enhanced to a desired extent.

Figure 3:
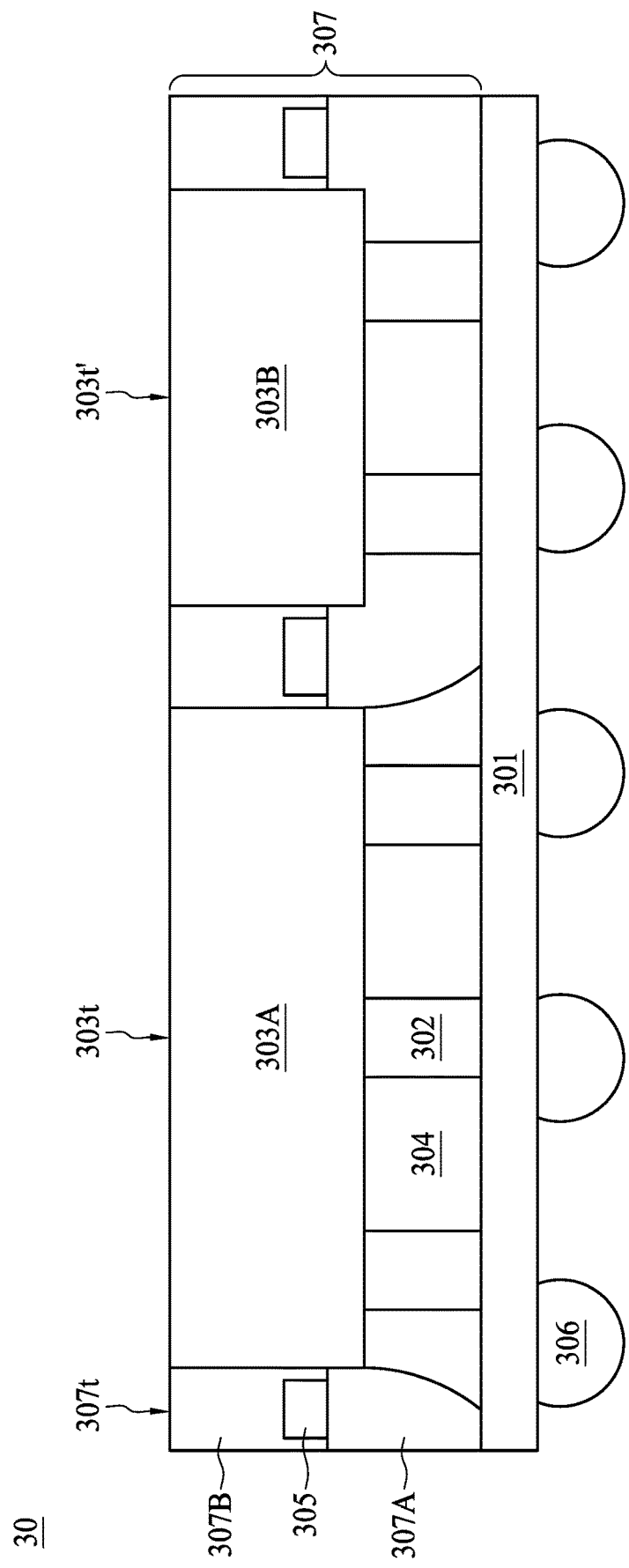
FIG. 3 is a cross-sectional view of a semiconductor package structure, according to some embodiments of the present disclosure.

Referring to FIG. 3, FIG. 3 is a cross-sectional view of a semiconductor package structure 30, according to some embodiments of the present disclosure. The semiconductor package structure 30 includes a semiconductor die 303A and a semiconductor die 303B positioned over a conductive trace layer 301. The semiconductor dies 303A and 303B are surrounded by a structure enhancement layer 305 from sidewalls of the semiconductor dies 303A and 303B. It should be noted that a thickness of the semiconductor dies 303A and 303B are substantially identical, and the corresponding structure enhancement layer 305 surrounding the semiconductor dies 303A and 303B can have a uniform thickness. A space filled with an encapsulant 307 between the structure enhancement layer 305 and the sidewalls of the semiconductor dies 303A and 303B is preserved, as previously discussed in FIG. 1.

The encapsulant 307 covers the semiconductor dies 303A and 303B and the structure enhancement layer 305, as well as the conductive trace layer 301. In some embodiments, the conductive trace layer 301 can be a redistribution layer (RDL) with one side connected to conductive terminals 306, such as solder bumps, and the opposite side electrically coupled to the semiconductor die 303A and 303B.

In some embodiments, the semiconductor die 303A and the semiconductor die 303B are connected to a top surface of the conductive trace layer 301 through one or a plurality of conductive bumps 302. Underfill material 304 surrounds the conductive bumps 302 of the semiconductor die 303A and is positioned between the bottom of the semiconductor die 303A and the top of the conductive trace layer 301.

In some embodiments, the structure enhancement layer 305 is substantially identical to the structure enhancement layer 105 described herein and can be referred thereto. In some embodiments, the encapsulant 307, including a first portion 307A of the encapsulant and a second portion 307B of the encapsulant, is substantially identical to the encapsulant 107 of the semiconductor package structure 10. A top surface 303t and a top surface 303t' of the semiconductor dies 303A and 303B, respectively, are exposed from a top surface 307t of the encapsulant 307.

In some embodiments, the semiconductor package structure 30 possesses a geometric center plane, which is a plane parallel to the top surface 303t and the top surface 303t' of the semiconductor dies 303A and 303B, and located at a geometric center of the package structure from a cross sectional view perspective. The semiconductor package structure 30 possesses a mass center plane, which is also a plane parallel to the top surface 303t and the top surface 303t' of the semiconductor dies 303A and 303B, and located at a mass center of the package structure from a cross sectional view perspective. In some embodiments, the geometric center plane coincides with the mass center plane of the semiconductor package structure 30, in order to effectively strengthen the mechanical strength of the semiconductor package and alleviate the warpage problem as previously addressed.

Figure 4B:
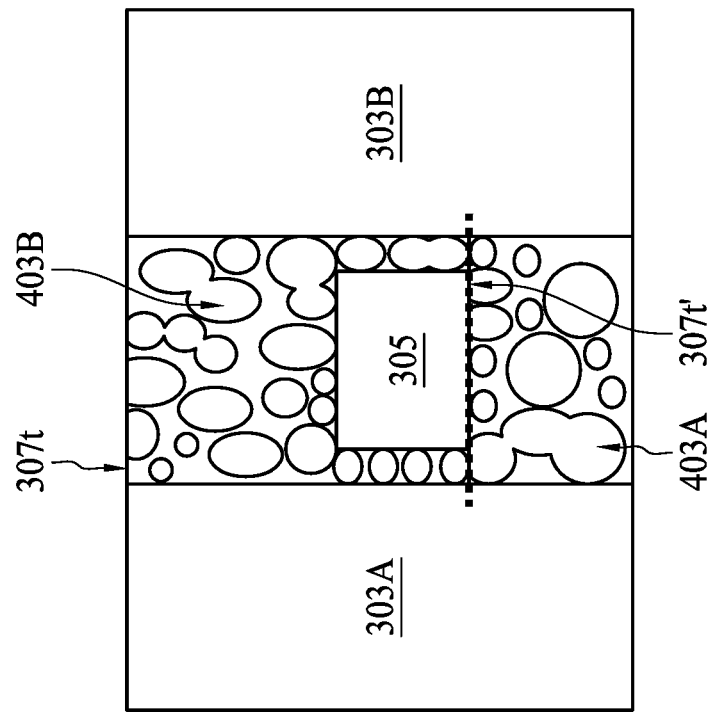
FIG. 4B is an enlarged view of a portion of the semiconductor package structure in FIG. 3, according to some embodiments of the present disclosure.
Figure 4A:
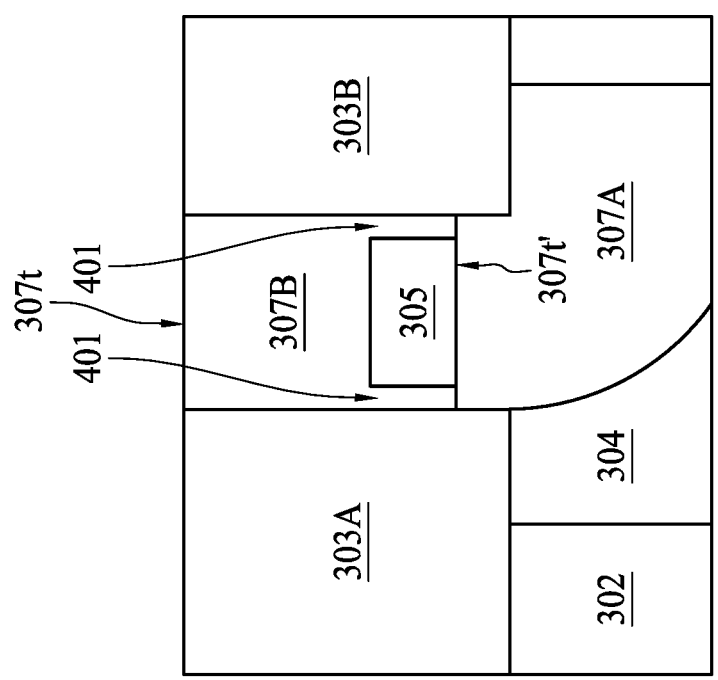
FIG. 4A is an enlarged view of a portion of the semiconductor package structure in FIG. 3, according to some embodiments of the present disclosure.

Referring to FIG. 4A and FIG. 4B, FIG. 4A and FIG. 4B are enlarged views of a portion of the semiconductor package structure 30 in FIG. 3, according to some embodiments of the present disclosure. In FIG. 4A, a portion of the structure enhancement layer 305 is positioned between the semiconductor die 303A and the semiconductor die 303B. Spaces between the structure enhancement layer 305 and the two semiconductor dies are filled with the second portion 307B of the encapsulant, forming filled gaps 401. The first portion 307A of the encapsulant has a continuous leveled surface 307t' supporting the structure enhancement layer 305. As further enlarged in FIG. 4B, conducting fillers 403A for heat conduction are illustrated in the first portion 307A of the encapsulant. Because no planarization operation is applied to the first portion 307A of the encapsulant, the conducting fillers 403A, especially those proximal to the continuous leveled surface 307t', all preserve their original shape, for example, spherical, elliptical, or a needle shape. In contrast, conducting fillers 403B in the second portion 307B of the encapsulant, especially those proximal to the top surface 307t, show cut-off features, for example, semispherical, or fragmented elliptical shapes as a result of a planarization operation applied thereto.

FIG. 5A to FIG. 5J are cross-sectional views of a semiconductor package structure 30 during various intermediate manufacturing operations, in accordance with some embodiments of the present disclosure. Identical numeric labels refer to substantially identical components or equivalents thereof, and are not repeated here for brevity. A carrier 500, such as temporary substrate, is provided in FIG. 5A. A conductive trace layer 301 is subsequently formed over a receiving surface of the carrier 500, as shown in FIG. 5B. In FIG. 5C, semiconductor dies 303A and 303B are subsequently flip chip bonded to the conductive trace layer 301 through conductive bumps 302 on the active surface of the semiconductor dies 303A and 303B. An underfill 304 is applied to surround the conductive bumps 302 under the semiconductor die 303A, as illustrated in FIG. 5D. In FIG. 5E and FIG. 5F, a first portion 307A of the encapsulant is formed over the conductive trace layer 301 and surrounds the conductive bumps 302 as well as a portion of sidewalls of the semiconductor dies 303A and 303B. A top surface 307t' of the first portion 307A of the encapsulant is controlled by the manufacturing operations based on the calculation of the position of the structure enhancement layer 305 in the semiconductor package structure 30. Alternatively stated, since the structure enhancement layer 305 is directly positioned on the top surface 307t' of the first portion 307A of the encapsulant, as shown in FIG. 5F, determining the position of the structure enhancement layer 305 in the semiconductor package structure 30 shall be done prior to the formation of the first portion 307A of the encapsulant. The encapsulant can be composed of a molding compound filled with a first type of conducting fillers.

In FIG. 5G, a second portion 307B of the encapsulant is formed over the structure enhancement layer 305 to an extent of filling gaps 401 between the semiconductor dies 303A and 303B, as well as covering top surfaces 303t and 303t' of the semiconductor dies 303A and 303B, respectively. In some embodiments, as shown in FIG. 5H, an optional grinding operation is performed to expose the top surfaces 303t and 303t' of the semiconductor dies 303A and 303B from the second portion 307B of the encapsulant. In FIG. 5I and FIG. 5J, the carrier 500 is detached and conductive terminals 306 are mounted to the conductive trace layer 306. The semiconductor package structure 30 is then formed after die saw operations. In FIG. 5A to FIG. 5J, the conductive trace layer is formed prior to die bonding, and is referred to as a chip last operation herein.

Figure 6:
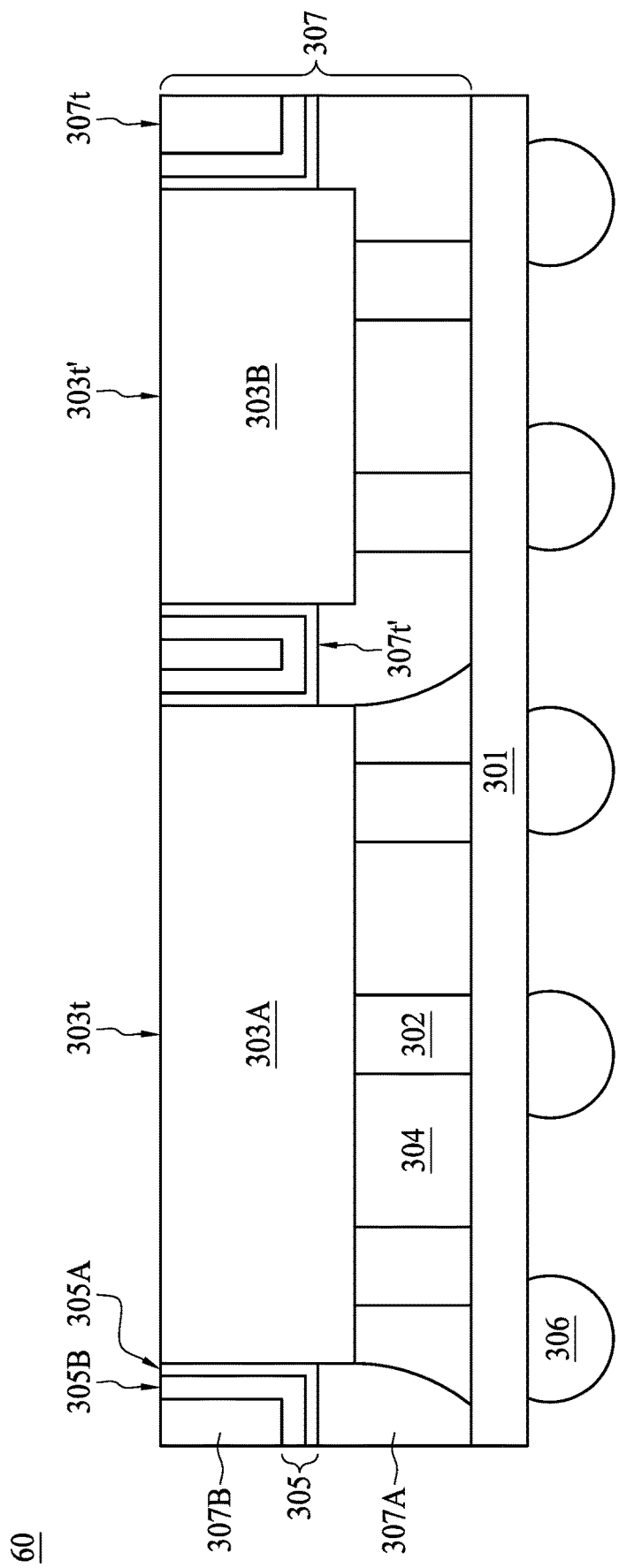
FIG. 6 is a cross-sectional view of a semiconductor package structure, according to some embodiments of the present disclosure.

Referring to FIG. 6, FIG. 6 is a cross-sectional view of a semiconductor package structure 60, according to some embodiments of the present disclosure. The semiconductor package structure 60 includes a semiconductor die 303A and a semiconductor die 303B positioned over a conductive trace layer 301. The semiconductor dies 303A and 303B are surrounded by a structure enhancement layer 305 from sidewalls of the semiconductor dies 303A and 303B. It should be noted that a thickness of the semiconductor dies 303A and 303B are substantially identical, and the corresponding structure enhancement layer 305 surrounding the semiconductor dies 303A and 303B can have a uniform thickness. A space filled with an encapsulant 307 between the structure enhancement layer 305 and the sidewalls of the semiconductor dies 303A and 303B is preserved, as previously discussed in FIG. 1.

The encapsulant 307 covers the semiconductor dies 303A and 303B and the structure enhancement layer 305, as well as the conductive trace layer 301. In some embodiments, the conductive trace layer 301 can be a redistribution layer (RDL) with one side connected to conductive terminals 306, such as solder bumps, and the opposite side electrically coupled to the semiconductor die 303A and 303B.

In some embodiments, the semiconductor die 303A and the semiconductor die 303B are connected to a top surface of the conductive trace layer 301 through one or a plurality of conductive bumps 302. Underfill material 304 surrounds the conductive bumps 302 of the semiconductor die 303A and is positioned between the bottom of the semiconductor die 303A and the top of the conductive trace layer 301.

In some embodiments, the structure enhancement layer 305 surrounds the sidewalls 303s of the semiconductor dies 303A and 303B as well as over the top surface 307t' of the first portion 307A of the encapsulant. It should be noted that the structure enhancement layer 305 of the semiconductor package structure 60 includes a seed layer 305A and a metal layer 305B over the seed layer 305A. Each of the seed layer 305A and the metal layer 305B forms a continuous layer. The seed layer 305A is thinner than the metal layer 305B, which is electroplated, for example, to predetermined thickness. A boundary can be observed between the seed layer 305A and the metal layer 305B due to the transfer from a seed layer deposition operation to a metal layer electroplating operation. In some embodiments, the structure enhancement layer 305 shows a "U" shape conforming to the entire sidewalls 303s of the semiconductor dies 303A, 303B and the top surface 307t' of the first portion 307A of the encapsulant.

In some embodiments, the encapsulant 307 is substantially identical to the encapsulant 107 of the semiconductor package structure 10. A top surface 303t and a top surface 303t' of the semiconductor dies 303A and 303B, respectively, are exposed from the top surface 307t of the encapsulant 307. A second portion 307B of the encapsulant is not in contact with the first portion 307A of the encapsulant and is spaced apart therefrom by the structure enhancement layer 305 in the semiconductor package structure 60.

In some embodiments, the semiconductor package structure 60 possesses a geometric center plane, which is a plane parallel to the top surface 303t and the top surface 303t' of the semiconductor dies 303A and 303B, and located at a geometric center of the package structure from a cross sectional view perspective. The semiconductor package structure 60 possesses a mass center plane, which is also a plane parallel to the top surface 303t and the top surface 303t' of the semiconductor dies 303A and 303B, and located at a mass center of the package structure from a cross sectional view perspective. In some embodiments, the geometric center plane coincides with the mass center plane of the semiconductor package structure 60, in order to effectively strengthen the mechanical strength of the semiconductor package and alleviate the warpage problem as previously addressed.

Referring to FIG. 7A and FIG. 7B, FIG. 7A and FIG. 7B are enlarged views of a portion of the semiconductor package structure 60 in FIG. 6, according to some embodiments of the present disclosure. In FIG. 7A, a portion of the structure enhancement layer 305 is positioned between the semiconductor dies 303A and the semiconductor die 303B. The first portion 307A of the encapsulant has a continuous leveled surface 307t' supporting the structure enhancement layer 305. As further enlarged in FIG. 7B, conducting fillers 403A for heat conduction are illustrated in the first portion 307A of the encapsulant. Because no planarization operation is applied to the first portion 307A of the encapsulant, the conducting fillers 403A, especially those proximal to the continuous leveled surface 307t', all preserve their original shape, for example, spherical, elliptical, or a needle shape. In contrast, conducting fillers 403B in the second portion 307B of the encapsulant, especially those proximal to the top surface 307t, show cut-off features, for example, semi-spherical, or fragmented elliptical shapes as a result of a planarization operation applied thereto.

Figure 8D:
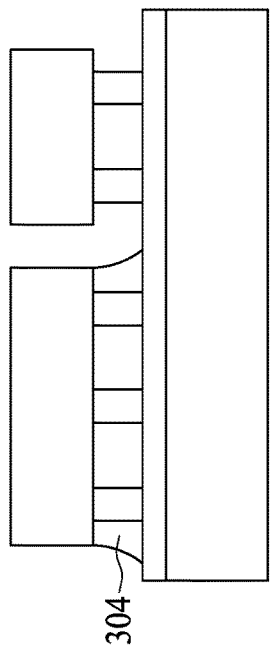
FIG. 8A, FIG. 8B, FIG. 8C, FIG. 8D, FIG. 8E, FIG. 8F, FIG. 8G, FIG. 8H, FIG. 8I, FIG. 8J, and FIG. 8K are cross-sectional views of a semiconductor package structure during various intermediate manufacturing operations, in accordance with some embodiments of the present disclosure.
Figure 8E:
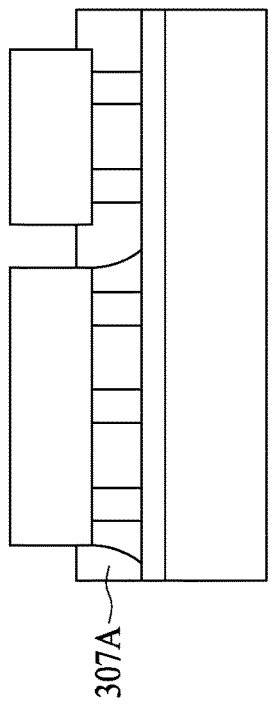
Figure 8F:
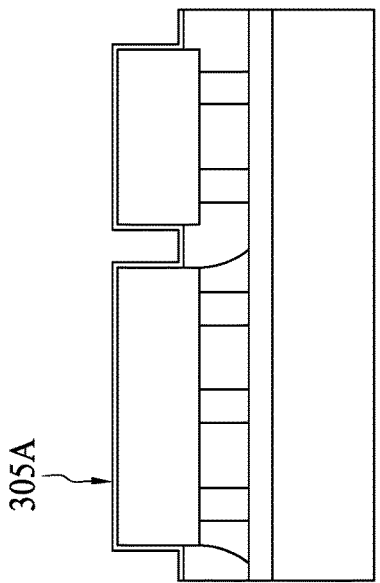
Figure 8A:
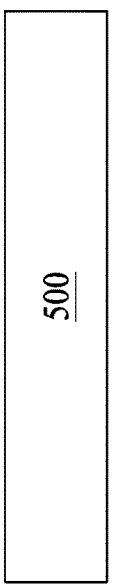
Figure 8B:
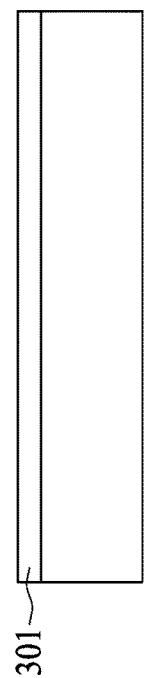
Figure 8C:
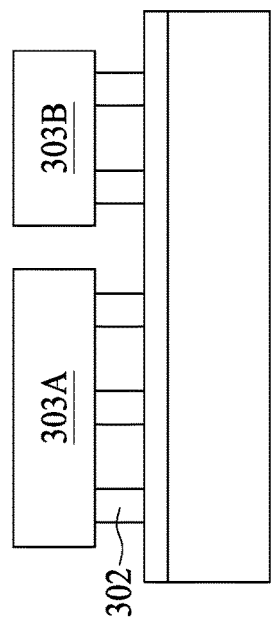
Figure 8I:
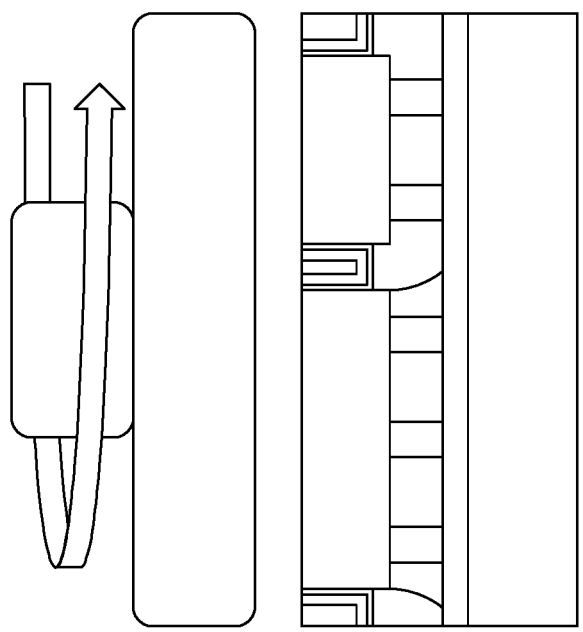
Figure 8G:
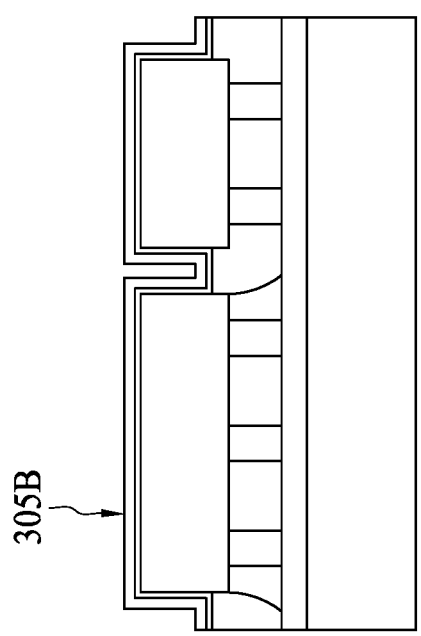
Figure 8H:
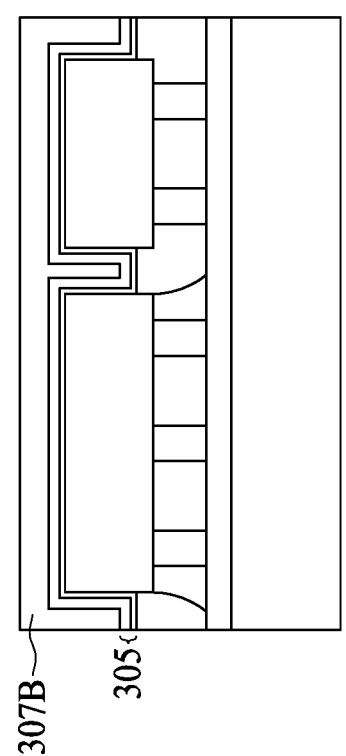

FIG. 8A to FIG. 8K are cross-sectional views of a semiconductor package structure 60 during various intermediate manufacturing operations, in accordance with some embodiments of the present disclosure. Identical numeric labels refer to substantially identical components or equivalents thereof, and are not repeated here for brevity. The description of FIG. 8A to FIG. 8E can be referred to in the description of FIG. 5A to FIG. 5E and is not repeated here for brevity. In FIG. 8F, a seed layer deposition operation is carried out by sputtering, for example. A seed layer 305A is formed conformally over the top surface and the sidewalls of the semiconductor dies 303A, 303B, as well as the top surface 307t' of the first portion 307A of the encapsulant. In FIG. 8G, an electroplating operation is carried out to form a conformal metal layer 305B to a predetermined thickness, and usually the predetermined thickness is greater than a thickness of the seed layer 305A. As shown in FIG. 8H, a second portion 307B of the encapsulant is formed over the structure enhancement layer 305 by covering the top surface and the spaces between the semiconductor dies 303A, 303B.

Figure 8J:
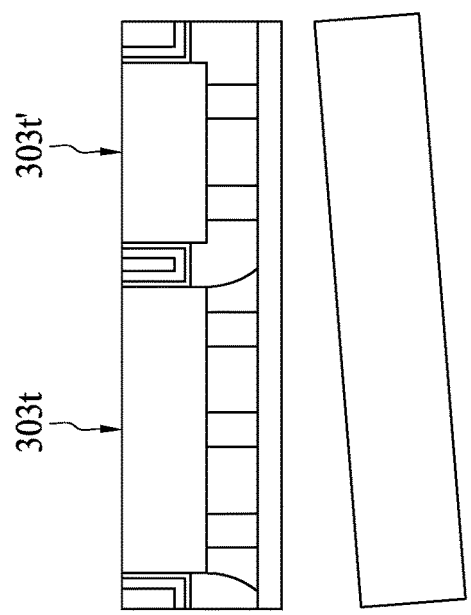
Figure 8K:
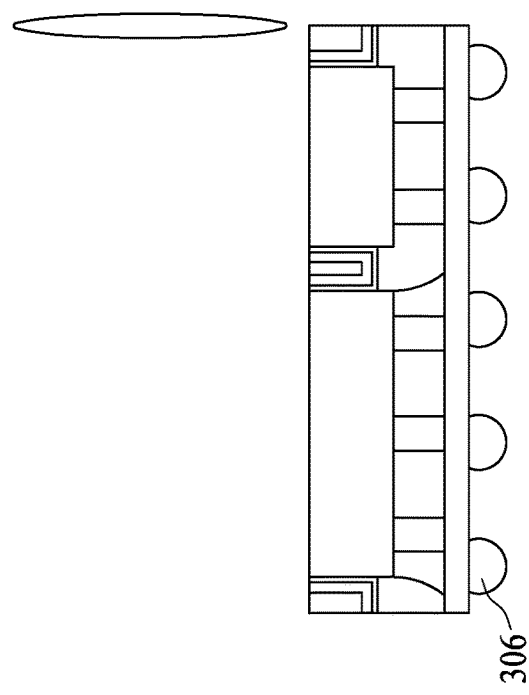

Similar to FIG. 5H to FIG. 5J, FIG. 8I shows an optional grinding operation performed to expose the top surfaces 303t and 303t' of the semiconductor dies 303A and 303B from the second portion 307B of the encapsulant. In FIG. 8J and FIG. 8K, the carrier 500 is detached and conductive terminals 306 are mounted to the conductive trace layer 301. The semiconductor package structure 60 is then formed after die saw operations. In FIG. 8A to FIG. 8K, the conductive trace layer is formed prior to die bonding, and is referred to as a chip last operation herein.

Figure 9:
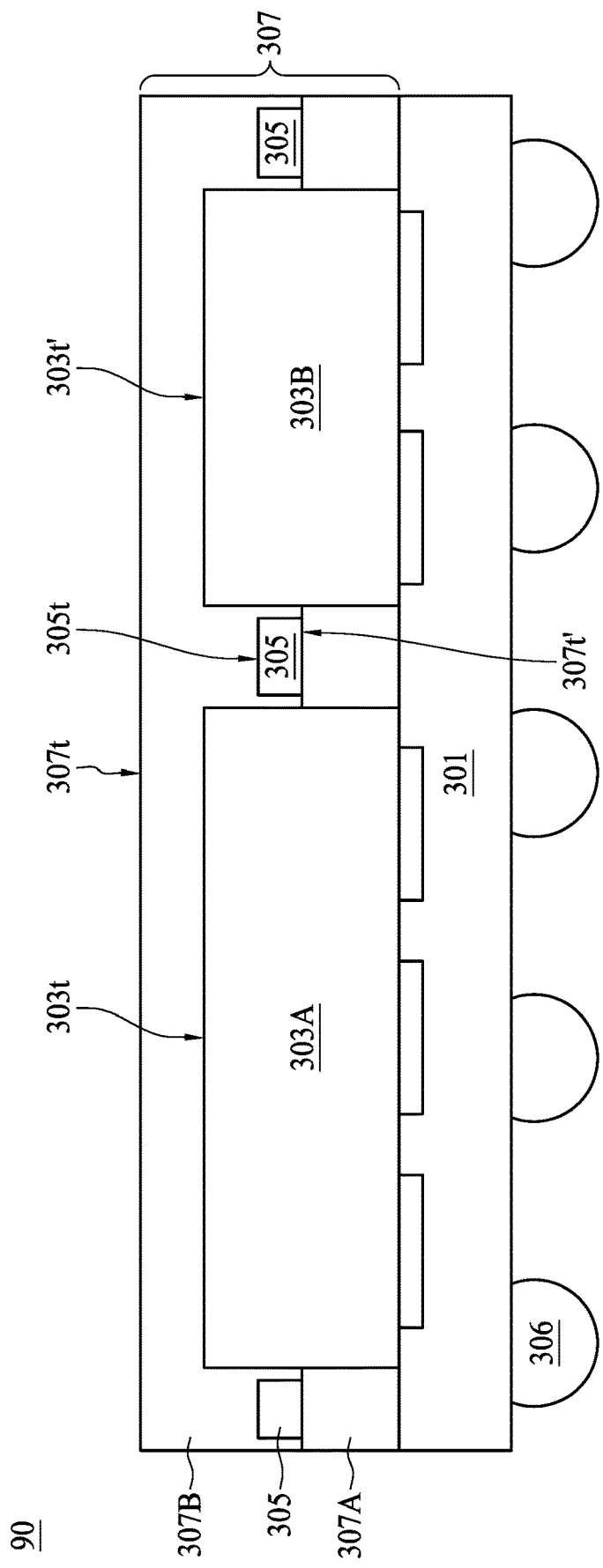
FIG. 9 is a cross-sectional view of a semiconductor package structure, according to some embodiments of the present disclosure.

Referring to FIG. 9, FIG. 9 is a cross-sectional view of a semiconductor package structure 90, according to some embodiments of the present disclosure. Identical numeric labels refer to substantially identical components or equivalents thereof, and are not repeated here for brevity. The semiconductor package structure 90 is similar to the semiconductor package structure 30 of FIG. 3 except that the semiconductor package structure 90 is manufactured by a chip first operation, as will be described in FIG. 11. The top surfaces 303t, 303t' of the semiconductor dies 303A, 303B are covered by the second portion 307B of the encapsulant. The top surface 307t of the encapsulant is higher than the top surface 305t of the structure enhancement layer 305.

Referring to FIG. 10A and FIG. 10B, FIG. 10A and FIG. 10B are enlarged views of a portion of the semiconductor package structure 90 in FIG. 9, according to some embodiments of the present disclosure. In FIG. 10A, a portion of the structure enhancement layer 305 is positioned between the semiconductor dies 303A and the semiconductor die 303B. Spaces between the structure enhancement layer 305 and the two semiconductor dies are filled with the second portion 307B of the encapsulant, forming filled gaps 1001. The first portion 307A of the encapsulant has a continuous leveled surface 307t' supporting the structure enhancement layer 305. Conducting fillers 1003A, 1003B for heat conduction are illustrated in the first portion 307A and the second portion 307B of the encapsulant, respectively. Because no planarization operation is applied to the first portion 307A and the second portion 307B of the encapsulant, the conducting fillers 1003A and 1003B, especially those proximal to the continuous leveled surface 307t' and the top surface 307t, all preserve their original shape, for example, spherical, elliptical, or a needle shape. In FIG. 10B, because the conductive trace layer 301 is formed after the formation of the encapsulant 307, surface roughness of the first portion 307A of the encapsulant can be observed at the bottom surface 307b' of the encapsulant by the filling of the conductive trace layer 301 material into the recesses at the bottom surface 307b' of the encapsulant.

FIG. 11A to FIG. 11K are cross-sectional views of a semiconductor package structure 90 during various intermediate manufacturing operations, in accordance with some embodiments of the present disclosure. Identical numeric labels refer to substantially identical components or equivalents thereof, and are not repeated here for brevity. A carrier 500, such as temporary substrate, is provided in FIG. 11A. An adhesive layer 501 is provided over the receiving surface of the carrier 500 in FIG. 11B. In FIG. 11C, semiconductor dies 303A and 303B are subsequently placed over the adhesive layer 501 with an active surface facing the adhesive layer 501. In FIG. 11D, a first portion 307A of the encapsulant is formed over the adhesive layer 501 and surrounds a portion of the sidewall of the semiconductor dies 303A and 303B. In FIG. 11E, the structure enhancement layer 305 is laminated over the first portion 307A of the encapsulant. A top surface 307t' of the first portion 307A of the encapsulant is controlled by the manufacturing operations based on the calculation of the position of the structure enhancement layer 305 in the semiconductor package structure 90. Alternatively stated, since the structure enhancement layer 305 is directly positioned on the top surface 307t' of the first portion 307A of the encapsulant, as shown in FIG. 11E, determining the position of the structure enhancement layer 305 in the semiconductor package structure 90 shall be done prior to the formation of the first portion 307A of the encapsulant. The encapsulant can be composed of molding compound filled with a first type of conducting fillers.

In FIG. 11F, the second portion 307B of the encapsulant is formed over the structure enhancement layer 305 to an extent of filling the gaps 1001 between the semiconductor dies 303A and 303B, as well as covering the top surfaces 303t and 303t' of the semiconductor dies 303A and 303B, respectively. In FIG. 11G, the carrier 500 and the adhesive layer 501 are detached, exposing conductive pads at the active surface of the semiconductor dies 303A, 303B. In FIG. 11H, a second carrier 503 is bonded to the top surface 307t of the second portion 307B of the encapsulant. The intermediate semiconductor package structure is then flipped upside down to build the conductive trace layer 301 over the active surface of the semiconductor dies 303A, 303B, followed by detaching the second carrier 503, as shown in FIG. 11I and FIG. 11J. In FIG. 11K, semiconductor package structure 90 is then formed after die saw operations. In FIG. 11A to FIG. 11K, the conductive trace layer is formed after the molding of the semiconductor die, and is referred to as a chip first operation herein.

Figure 12:
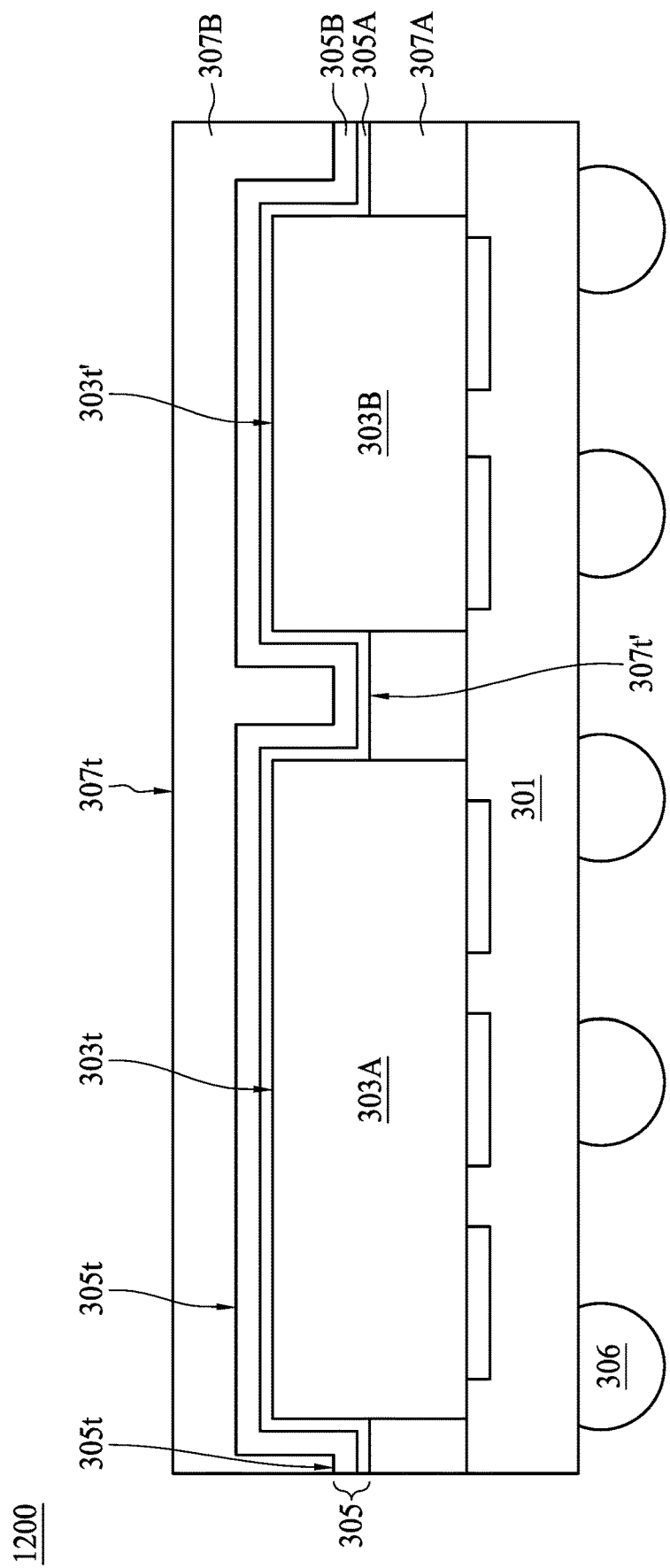
FIG. 12 is a cross-sectional view of a semiconductor package structure, according to some embodiments of the present disclosure.

FIG. 12 is a cross-sectional view of a semiconductor package structure 1200, according to some embodiments of the present disclosure. Identical numeric labels refer to substantially identical components or equivalents thereof, and are not repeated here for brevity. The semiconductor package structure 1200 is similar to the semiconductor package structure 60 of FIG. 6 except that the semiconductor package structure 1200 is manufactured by a chip first operation, as will be described in FIG. 14. The top surfaces 303t, 303t' of the semiconductor dies 303A, 303B are covered by the second portion 307B of the encapsulant. The top surface 307t of the encapsulant is higher than the top surface 305t of the structure enhancement layer 305.

FIG. 13A, FIG. 13B, and FIG. 13C are enlarged views of a portion of the semiconductor package structure 1200 in FIG. 12, according to some embodiments of the present disclosure. In FIG. 13A, a portion of the structure enhancement layer 305 is positioned between the semiconductor die 303A and the semiconductor die 303B. The first portion 307A of the encapsulant has a continuous leveled surface 307t' supporting the structure enhancement layer 305. In FIG. 13B, conducting fillers 1303A, 1303B for heat conduction are illustrated in the first portion 307A and the second portion 307B of the encapsulant, respectively. Because no planarization operation is applied to the first portion 307A and the second portion 307B of the encapsulant, the conducting fillers 1303A and 1303B, especially those proximal to the continuous leveled surface 307t' and the top surface 307t, all preserve their original shape, for example, spherical, elliptical, or a needle shape. In FIG. 13C, because the conductive trace layer 301 is formed after the formation of the encapsulant 307, a surface roughness of the first portion 307A of the encapsulant can be observed at the bottom surface 307b' of the encapsulant by the filling of the conductive trace layer 301 material into the recesses at the bottom surface 307b' of the encapsulant.

Figure 14I:
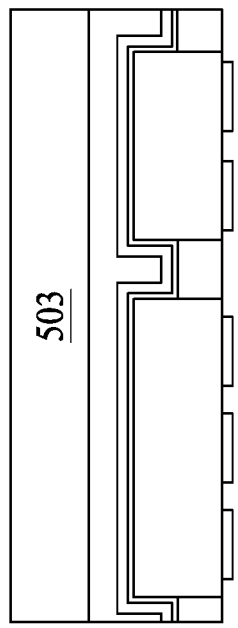
Figure 14J:
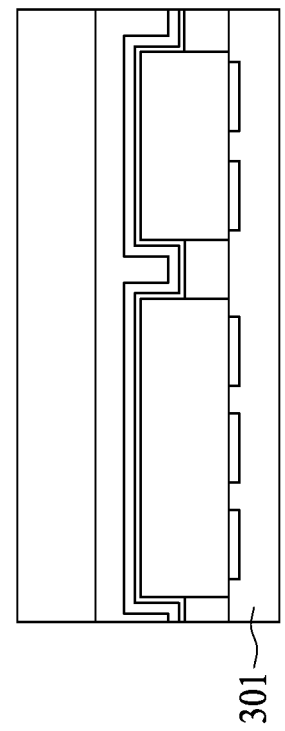
Figure 14G:
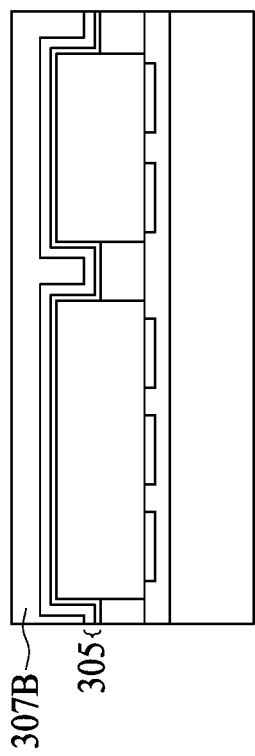

FIG. 14A to FIG. 14L are cross-sectional views of a semiconductor package structure 1200 during various intermediate manufacturing operations, in accordance with some embodiments of the present disclosure. Identical numeric labels refer to substantially identical components or equivalents thereof, and are not repeated here for brevity. A carrier 500, such as temporary substrate, is provided in FIG. 14A. An adhesive layer 501 is provided over the receiving surface of the carrier 500 in FIG. 14B. In FIG. 14C, semiconductor dies 303A and 303B are subsequently placed over the adhesive layer 501 with an active surface facing the adhesive layer 501. In FIG. 14D, a first portion 307A of the encapsulant is formed over the adhesive layer 501 and surrounds a portion of the sidewall of the semiconductor dies 303A and 303B. In FIG. 14E, a seed layer deposition operation is carried out by sputtering, for example. A seed layer 305A is formed conformally over the top surface and the sidewalls of the semiconductor dies 303A, 303B, as well as the top surface 307t' of the first portion 307A of the encapsulant. In FIG. 14F, an electroplating operation is carried out to form a conformal metal layer 305B to a predetermined thickness, and usually the predetermined thickness is greater than a thickness of the seed layer 305A. As shown in FIG. 14G, a second portion 307B of the encapsulant is formed over the structure enhancement layer 305 by covering the top surface and a portion of the sidewalls of the semiconductor dies 303A, 303B. The encapsulant can be composed of a molding compound filled with a first type of conducting fillers.

Figure 14H:
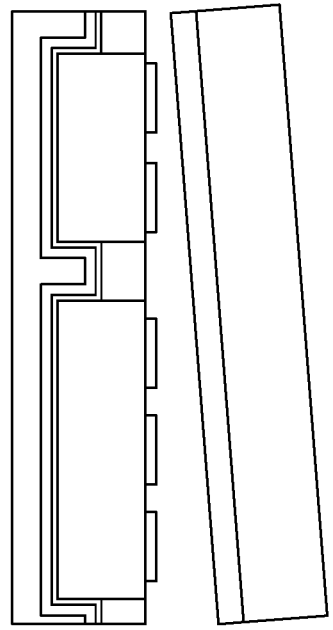
Figure 14K:
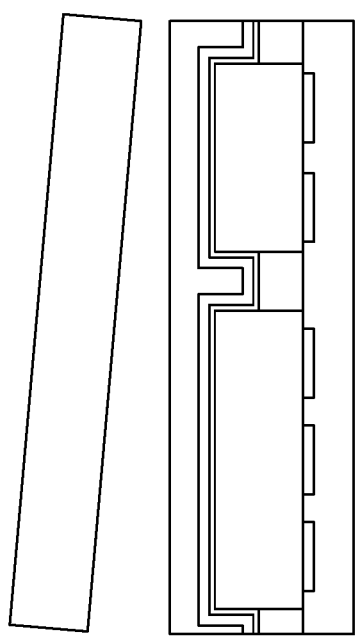
Figure 14L:
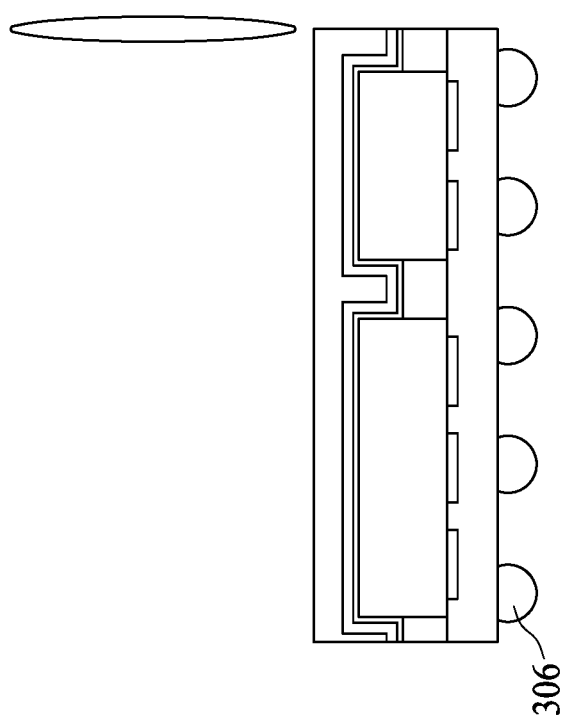

In FIG. 14H, the carrier 500 and the adhesive layer 501 are detached, thereby exposing conductive pads at the active surface of the semiconductor dies 303A, 303B. In FIG. 14I, a second carrier 503 is bonded to the top surface 307t of the second portion 307B of the encapsulant. The intermediate semiconductor package structure is then flipped upside down to build conductive trace layer 301 over the active surface of the semiconductor dies 303A, 303B, followed by detaching the second carrier 503, as shown in FIG. 14J and FIG. 14K. In FIG. 14L, semiconductor package structure 1200 is then formed after die saw operations. In FIG. 14A to FIG. 14L, the conductive trace layer is formed after the molding of the semiconductor die, and is referred to as a chip first operation herein.

Figure 15:
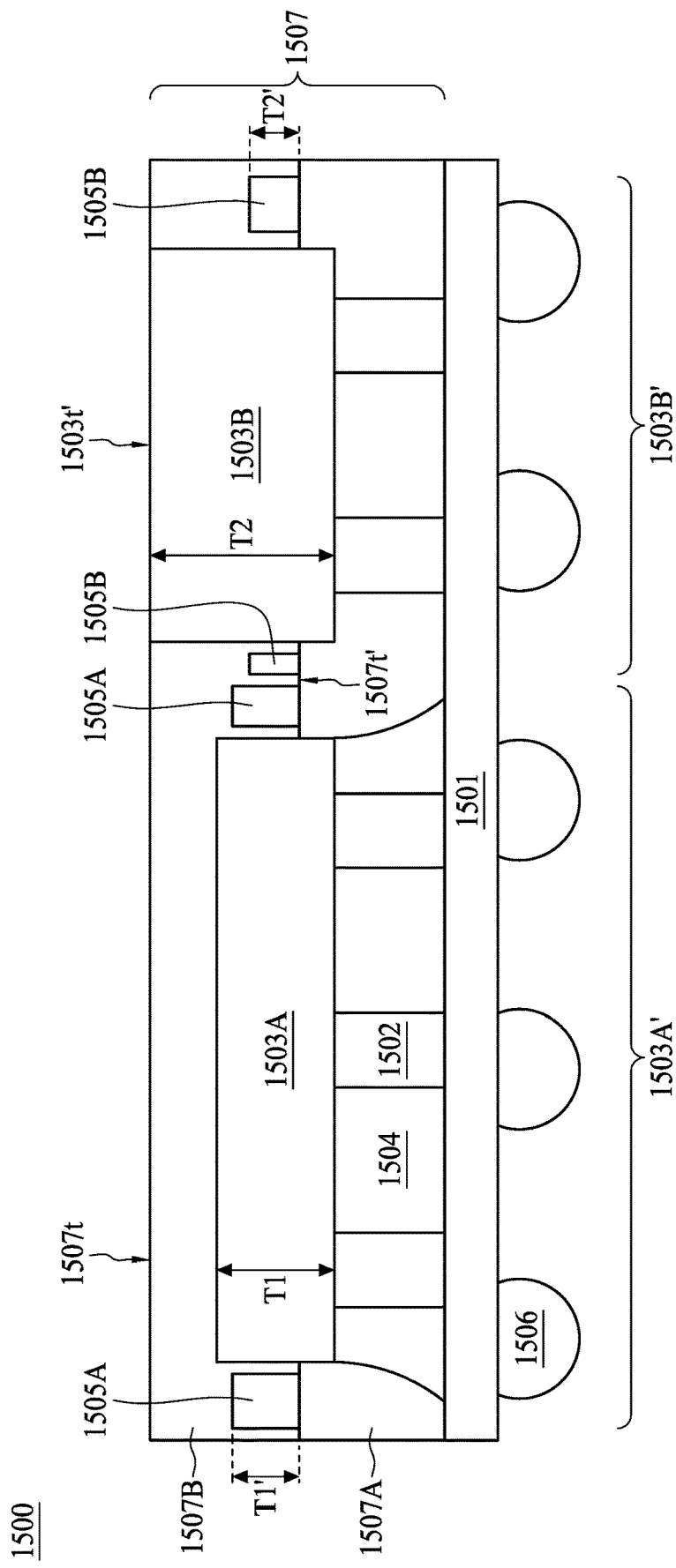
FIG. 15 is a cross-sectional view of a semiconductor package structure, according to some embodiments of the present disclosure.

FIG. 15 is a cross-sectional view of a semiconductor package structure 1500, according to some embodiments of the present disclosure. The semiconductor package structure 1500 includes a semiconductor die 1503A and a semiconductor die 1503B positioned over a conductive trace layer 1501. The semiconductor dies 1503A is surrounded by a first structure enhancement layer 1505A from sidewalls of the semiconductor die 1503A. The semiconductor dies 1503B is surrounded by a second structure enhancement layer 1505B from sidewalls of the semiconductor die 1503B.

When the semiconductor dies 1503A and 1503B are composed of substantially identical materials, and the structure enhancement layer 1505A and the structure enhancement layer 1505B are composed of substantially identical materials, a thicker semiconductor die specifies a thinner structure enhancement layer to obtain the desired package stiffness against the warpage problem previously discussed. In FIG. 15, a thickness T1 of the semiconductor die 1503A and a thickness T2 of the semiconductor die 1503B are different, for example, the thickness T2 is greater than the thickness T1. The structure enhancement layer 1505A surrounding the semiconductor die 1503A has a thickness T1' greater than the thickness T2' of the structure enhancement layer 1505B surrounding the semiconductor die 1503B.

An encapsulant 1507 covers the semiconductor dies 1503A and 1503B and the structure enhancement layers 1505A and 1505B, as well as the conductive trace layer 1501. In some embodiments, the conductive trace layer 1501 can be a redistribution layer (RDL) with one side connected to conductive terminals 1506, such as solder bumps, and the opposite side electrically coupled to the semiconductor dies 1503A and 1503B.

In some embodiments, the semiconductor die 1503A and the semiconductor die 1503B are connected to a top surface of the conductive trace layer 1501 through one or a plurality of conductive bumps 1502. Underfill material 1504 surrounds the conductive bumps 1502 of the semiconductor die 1503A and is positioned between the bottom of the semiconductor die 1503A and the top of the conductive trace layer 1501.

In some embodiments, the structure enhancement layers 1505A and 1505B are substantially identical to the structure enhancement layer 105 described herein and can be referred thereto. In some embodiments, the encapsulant 1507, including a first portion 1507A of the encapsulant and a second portion 1507B of the encapsulant, are substantially identical to the encapsulant 107 of the semiconductor package structure 10. A top surface 1503t' of the semiconductor die 1503B having a greater thickness T2 is exposed from the top surface 1507t of the encapsulant 1507.

In some embodiments, the semiconductor package structure 1500 possesses a geometric center plane, which is a plane parallel to the top surface 1503t and the top surface 1503*t'* of the semiconductor dies 1503A and 1503B, and located at a geometric center of the package structure from a cross sectional view perspective. The semiconductor package structure 1500 possesses a mass center plane, which is also a plane parallel to the top surface 1503*t* and the top surface 1503*t'* of the semiconductor dies 1503A and 1503B, and located at a mass center of the package structure from a cross sectional view perspective. In some embodiments, the geometric center plane coincides with the mass center plane of the semiconductor package structure 1500, in order to effectively strengthen the mechanical strength of the semiconductor package and alleviate the warpage problem as previously addressed.

Figure 16B:
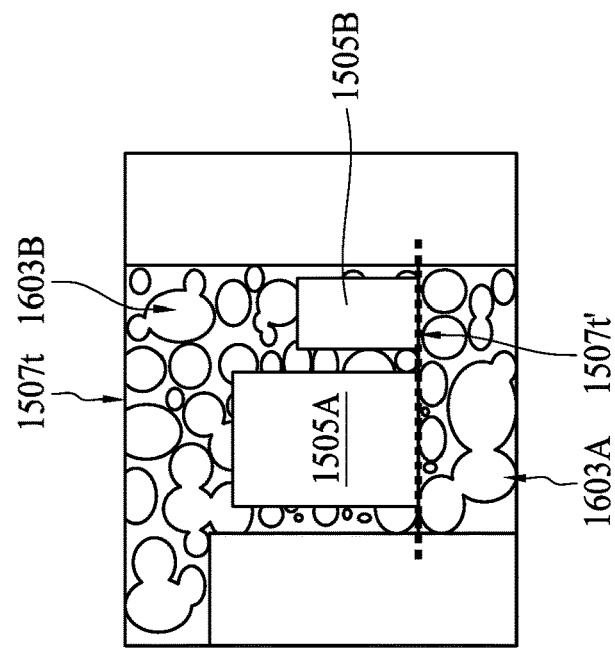
FIG. 16B is an enlarged view of a portion of the semiconductor package structure in FIG. 15, according to some embodiments of the present disclosure.
Figure 16A:
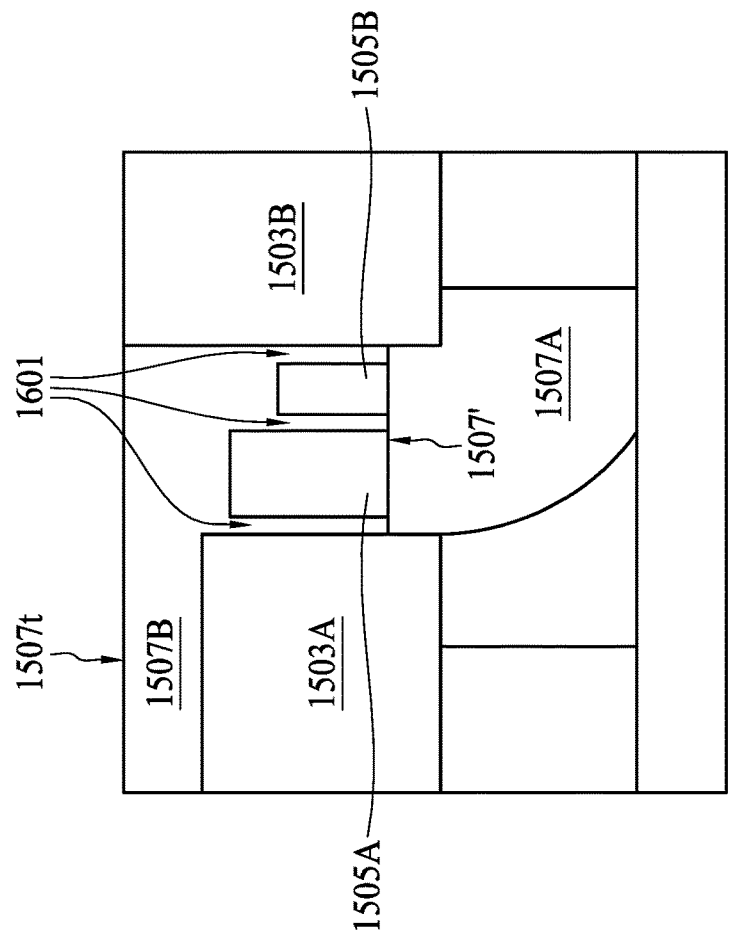
FIG. 16A is an enlarged view of a portion of the semiconductor package structure in FIG. 15, according to some embodiments of the present disclosure.

Referring to FIG. 16A and FIG. 16B, FIG. 16A and FIG. 16B are enlarged views of a portion of the semiconductor package structure 1500 in FIG. 15, according to some embodiments of the present disclosure. In FIG. 16A, a portion of the structure enhancement layers 1505A and 1505B are positioned between the semiconductor dies 1503A and 1503B. Spaces between the structure enhancement layers 1505A, 1505B and the two semiconductor dies are filled with the second portion 1507B of the encapsulant, forming filled gaps 1601. The first portion 1507A of the encapsulant has a continuous leveled surface 1507*t'* supporting the structure enhancement layers 1505A and 1505B. As further enlarged in FIG. 16B, conducting fillers 1603A for heat conduction are illustrated in the first portion 1507A of the encapsulant. Because no planarization operation is applied to the first portion 1507A of the encapsulant, the conducting fillers 1603A, especially those proximal to the continuous leveled surface 1507*t'*, all preserve their original shape, for example, spherical, elliptical, or a needle shape. In contrast, conducting fillers 1603B in the second portion 1507B of the encapsulant, especially those proximal to the top surface 1507*t*, show cut-off features, for example, semi-spherical, or fragmented elliptical shapes as a result of a planarization operation applied thereto.

Figure 17I:
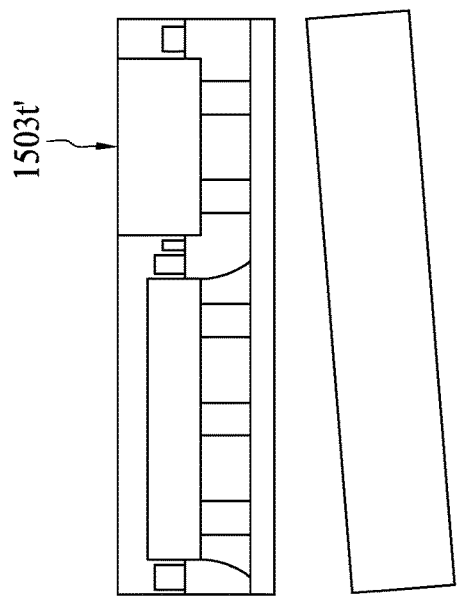
Figure 17J:
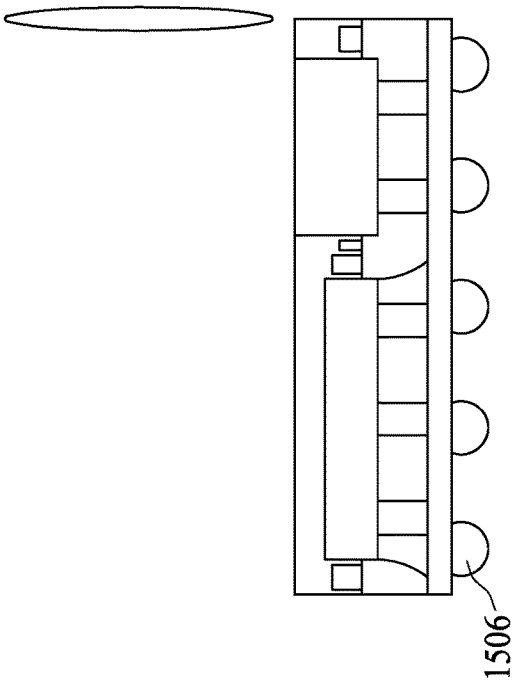
Figure 17G:
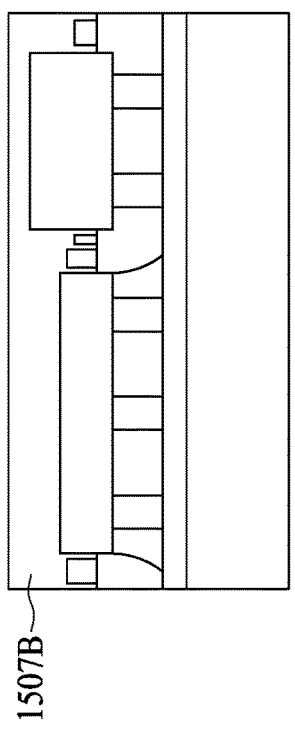
Figure 17H:
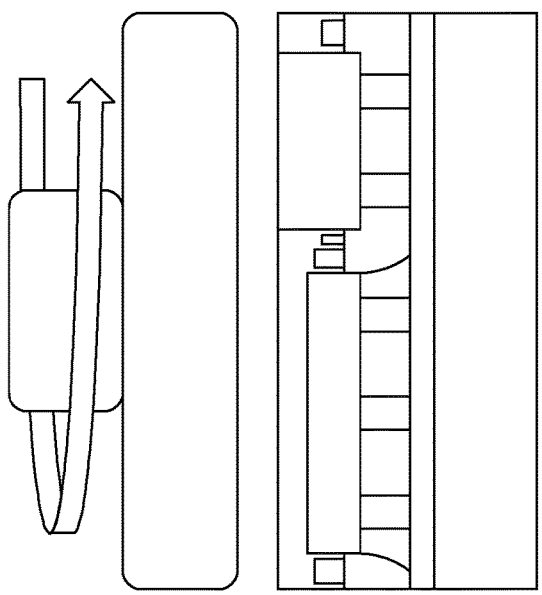

FIG. 17A to FIG. 17J are cross-sectional views of a semiconductor package structure 1500 during various intermediate manufacturing operations, in accordance with some embodiments of the present disclosure. Identical numeric labels refer to substantially identical components or equivalents thereof, and are not repeated here for brevity. The description of FIG. 17A to FIG. 17E can be referred to the description of FIG. 5A to FIG. 5E and is not repeated here for brevity. It should be noted that the thickness T1 of the semiconductor die 1503A is thinner than the thickness T2 of the semiconductor die 1503B. In FIG. 17F, a structure enhancement layer 1505A having a thickness T1' is laminated over the top surface 1507*t'* of the first portion 1507A of the encapsulant. Another structure enhancement layer 1505B having a thickness T2' thinner than the thickness T1' is laminated over the top surface 1507*t'* of the first portion 1507A of the encapsulant. In some embodiments, respective bottom surfaces of the structure enhancement layers 1505A and 1505B are coplanar and positioned on the top surface 1507*t'* of the first portion 1507A of the encapsulant. As shown in FIG. 17G, a second portion 1507B of the encapsulant is formed over the structure enhancement layer 1505A and 1505B by covering the top surface and the spaces between the semiconductor dies 1503A, 1503B.

Similar to FIG. 5H to FIG. 5J, FIG. 17H shows an optional grinding operation performed to expose the top surface 1503*t'* of the thicker semiconductor dies 1503B from the second portion 1507B of the encapsulant. In FIG. 17I and FIG. 17I, the carrier 500 is detached and conductive terminals 1506 mounted to the conductive trace layer 1501.

Semiconductor package structure 1500 is then formed after die saw operations. In FIG. 17A to FIG. 17I, the conductive trace layer is formed prior to the die bonding, and is referred to as a chip last operation herein.

Figure 18:
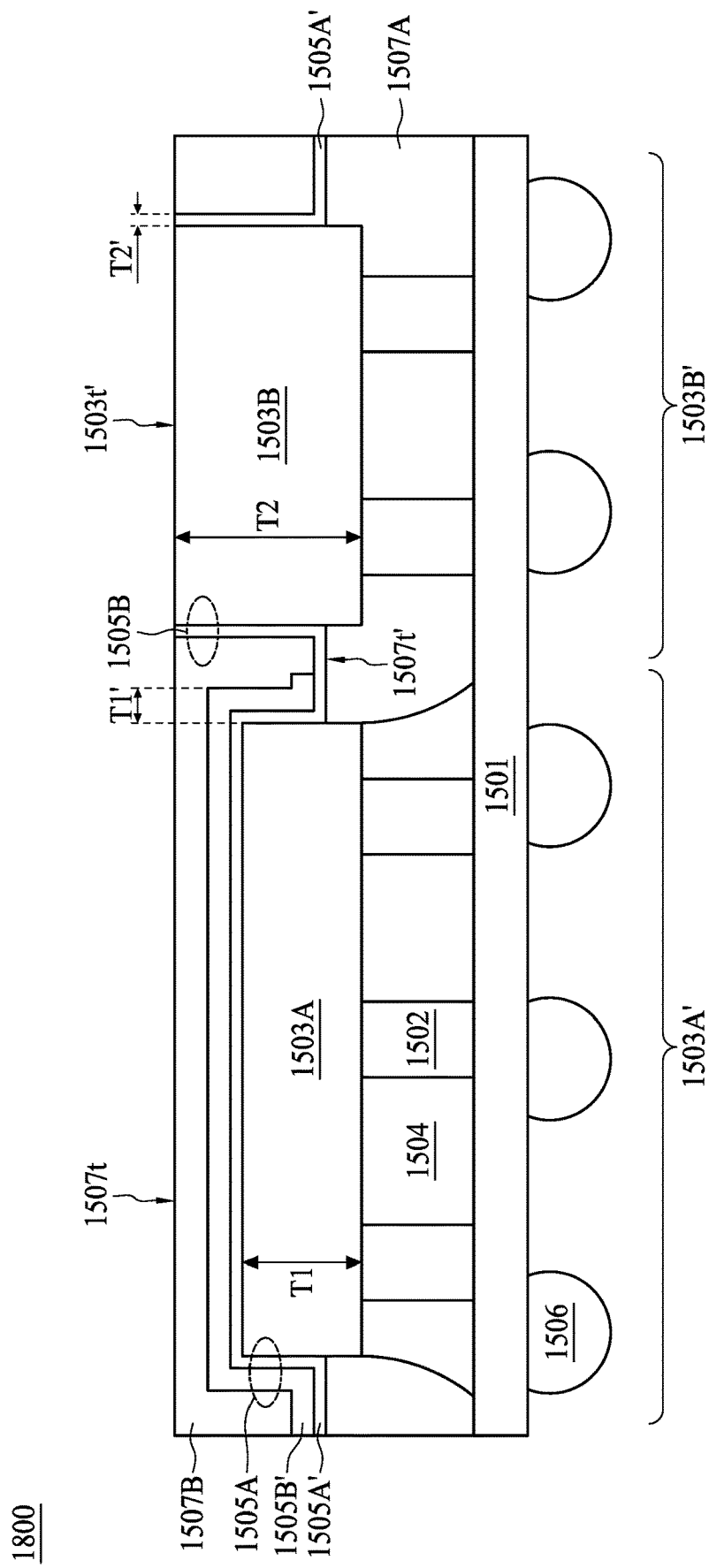
FIG. 18 is a cross-sectional view of a semiconductor package structure, according to some embodiments of the present disclosure.

Referring to FIG. 18, FIG. 18 is a cross-sectional view of a semiconductor package structure 1800, according to some embodiments of the present disclosure. The semiconductor package structure 1800 includes a semiconductor die 1503A and a semiconductor die 1503B positioned over a conductive trace layer 1501. The semiconductor die 1503A is surrounded by a first structure enhancement layer 1505A, and the semiconductor die 1503B is surrounded by a second structure enhancement layer 1505B. It should be noted that a thickness T1 of the semiconductor die 1503A is thinner than a thickness T2 of the semiconductor die 1503B, and the first structure enhancement layer 1505A surrounding the semiconductor die 1503A has a thickness T1' thicker than a thickness T2' of the second structure enhancement layer 1505B. A space filled with encapsulant 1507 between the structure enhancement layers 1505A, 1505B and the sidewalls of the semiconductor dies 1503A and 1503B is preserved, as previously discussed in FIG. 1.

An encapsulant 1507 covers the semiconductor dies 1503A and 1503B and the structure enhancement layers 1505A, 1505B, as well as the conductive trace layer 1501. In some embodiments, the conductive trace layer 1501 can be a redistribution layer (RDL) with one side connected to conductive terminals 1506, such as solder bumps, and the opposite side electrically coupled to the semiconductor dies 1503A and 1503B.

In some embodiments, the semiconductor die 1503A and the semiconductor die 1503B are connected to a top surface of the conductive trace layer 1501 through one or a plurality of conductive bumps 1502. Underfill material 1504 surrounds the conductive bumps 1502 of the semiconductor die 1503A and is positioned between the bottom of the semiconductor die 1503A and the top of the conductive trace layer 1501.

In some embodiments, a first structure enhancement layer 1505A surrounds the sidewalls 1503*s* of the semiconductor die 1503A and over a portion of the top surface 1507*t'* of the first portion 1507A of the encapsulant. The first structure enhancement layer 1505A is positioned in a first die region 1503A' of the semiconductor package structure 1800. It should be noted that the first structure enhancement layer 1505A of semiconductor package structure 1800 includes a seed layer 1505A' and a metal layer 1505B' over the seed layer 1505A'. Each of the seed layer 1505A' and the metal layer 1505B' forms a continuous layer. The seed layer 1505A' is thinner than the metal layer 1505B', which is electroplated, for example, to predetermined thickness. A boundary can be observed between the seed layer 1505A' and the metal layer 1505B' due to transfer from seed layer deposition operation to the metal layer electroplating operation.

In some embodiments, a second structure enhancement layer 1505B surrounds the sidewalls 1503*s* of the semiconductor die 1503B and over a portion of the top surface 1507*t'* of the first portion 1507A of the encapsulant. The second structure enhancement layer 1505B is positioned in a second die region 1503B' of the semiconductor package structure 1800. Unlike the first structure enhancement layer 1505A in the first die region 1503A', the second structure enhancement layer 1505B solely includes a seed layer 1505A'. Therefore, the thickness T2' of the second structure enhancement layer 1505B is thinner than the thickness T1' of the first structure enhancement layer 1505A.

In some embodiments, the encapsulant 1507 is substantially identical to the encapsulant 107 of the semiconductor package structure 10. A top surface 1503t' of the semiconductor die 1503B is exposed from the top surface 1507t of the encapsulant 1507. A second portion 1507B of the encapsulant is not in contact with the first portion 1507A of the encapsulant and is spaced apart therefrom by the structure enhancement layers 1505A, 1505B in the semiconductor package structure 1800.

In some embodiments, the semiconductor package structure 1800 possesses a geometric center plane, which is a plane parallel to the top surface 1503t and the top surface 1503t' of the semiconductor dies 1503A and 1503B, and located at a geometric center of the package structure from a cross sectional view perspective. The semiconductor package structure 1800 possesses a mass center plane, which is also a plane parallel to the top surface 1503t and the top surface 1503t' of the semiconductor dies 1503A and 1503B, and located at a mass center of the package structure from a cross sectional view perspective. In some embodiments, the geometric center plane coincides with the mass center plane of the semiconductor package structure 1800, in order to effectively strengthen the mechanical strength of the semiconductor package and alleviate the warpage problem as previously addressed.

Figure 19B:
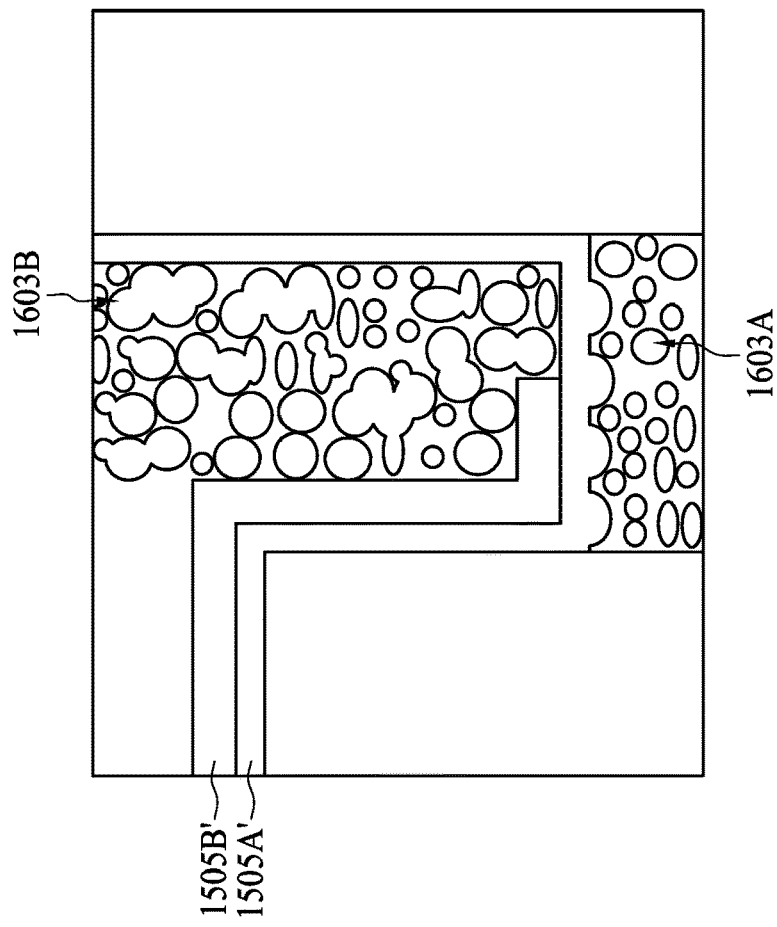
FIG. 19B is an enlarged view of a portion of the semiconductor package structure in FIG. 18, according to some embodiments of the present disclosure.
Figure 19A:
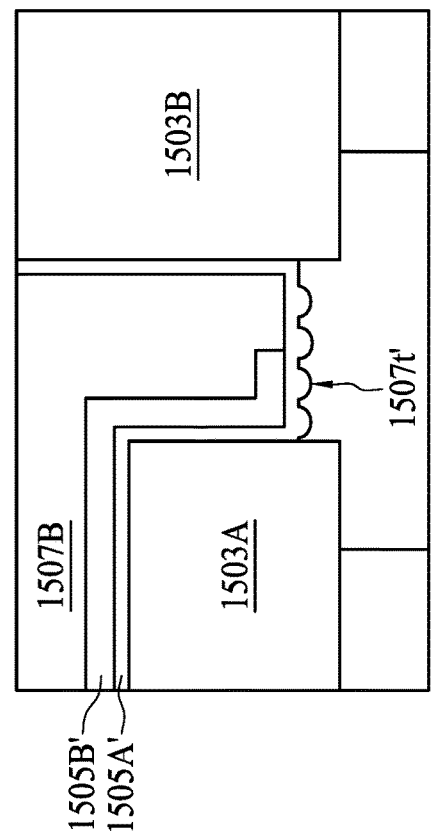
FIG. 19A is an enlarged view of a portion of the semiconductor package structure in FIG. 18, according to some embodiments of the present disclosure.

Referring to FIG. 19A and FIG. 19B, FIG. 19A and FIG. 19B are enlarged views of a portion of the semiconductor package structure 1800 in FIG. 18, according to some embodiments of the present disclosure. In FIG. 19A, a portion of the structure enhancement layers 1505A, 1505B is positioned between the semiconductor dies 1503A and the semiconductor die 1503B. The first portion 1507A of the encapsulant has a continuous leveled surface 1507t' supporting the structure enhancement layers 1505A, 1505B. As further enlarged in FIG. 19B, conducting fillers 1603A for heat conduction are illustrated in the first portion 1507A of the encapsulant. Because no planarization operation is applied to the first portion 1507A of the encapsulant, the conducting fillers 1603A, especially those proximal to the continuous leveled surface 1507t', all preserve their original shape, for example, spherical, elliptical, or a needle shape. In contrast, conducting fillers 1603B in the second portion 1507B of the encapsulant, especially those proximal to the top surface 1507t, show cut-off features, for example, semispherical, or fragmented elliptical shapes as a result of a planarization operation applied thereto.

As shown in FIG. 19B, the metal layer 1505B' and the seed layer 1505A' conform to the sidewall 1505s of the semiconductor die 1505A and a portion of the top surface 1507t', while solely the seed layer 1505A' conforms to the sidewall 1505s of the semiconductor die 1505B. A surface roughness of the first portion 1507A of the encapsulant can be observed at the top surface 1507t' by the filling of the seed layer 1505A' material into the recesses at the top surface 1507t' of the first portion 1507A.

Figure 20I:
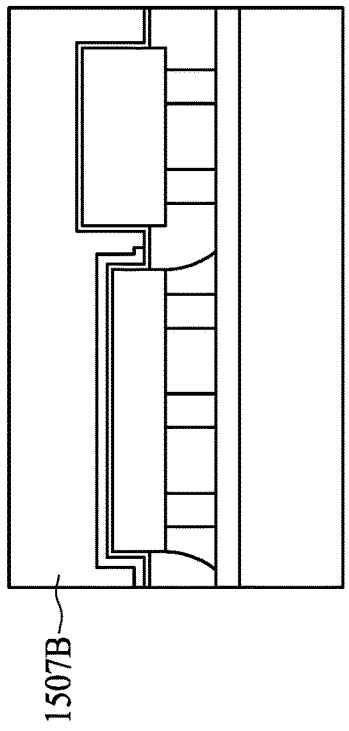
Figure 20J:
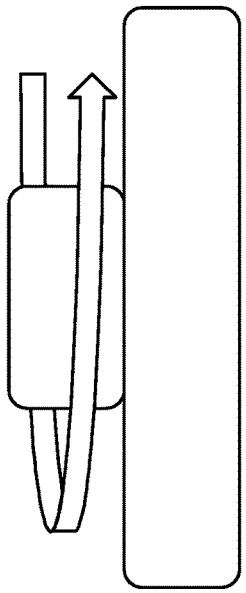
Figure 20G:
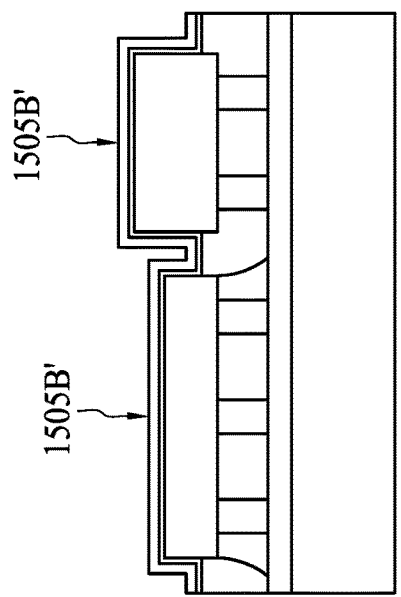
Figure 20H:
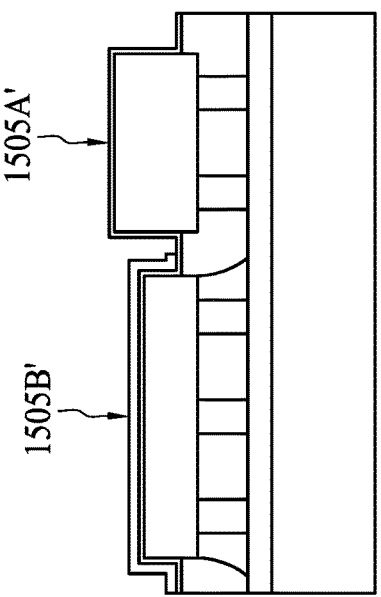

FIG. 20A to FIG. 20L are cross-sectional views of a semiconductor package structure 1800 during various intermediate manufacturing operations, in accordance with some embodiments of the present disclosure. Identical numeric labels refer to substantially identical components or equivalents thereof, and are not repeated here for brevity. The description of FIG. 20A to FIG. 20G can be referred to the description of FIG. 8A to FIG. 8G and is not repeated here for brevity. In FIG. 20H, a photolithography operation is performed to remove the metal layer 1505B' over the second die region 1503B'. For example, a photomask layer (not shown) can be patterned to cover the semiconductor die 1503A and the associated first die region 1503A', and expose the second semiconductor die 1503B and the associated second die region 1503B'. An etching operation may then be performed to remove the metal layer 1505B' in the second die region 1503B', thereby exposing the seed layer 1505A' in the second die region 1503B'. After the photolithography operation, the second structure enhancement layer 1505B over the second die region 1503B' is thinner than the first structure enhancement layer 1505A over the first die region 1503A'. In FIG. 20I, the second portion 1507B' of the encapsulant is formed over the first die region 1503A' and the second die region 1503B', covering the semiconductor dies 1503A, 1503B, and the corresponding first structure enhancement layer 1505A and the second structure enhancement layer 1505B.

Figure 20K:
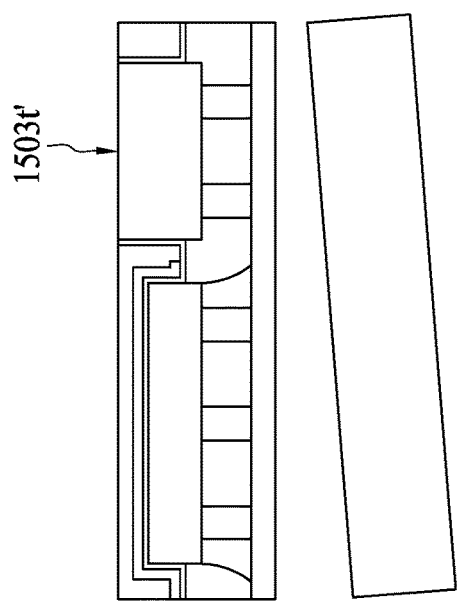
Figure 20L:
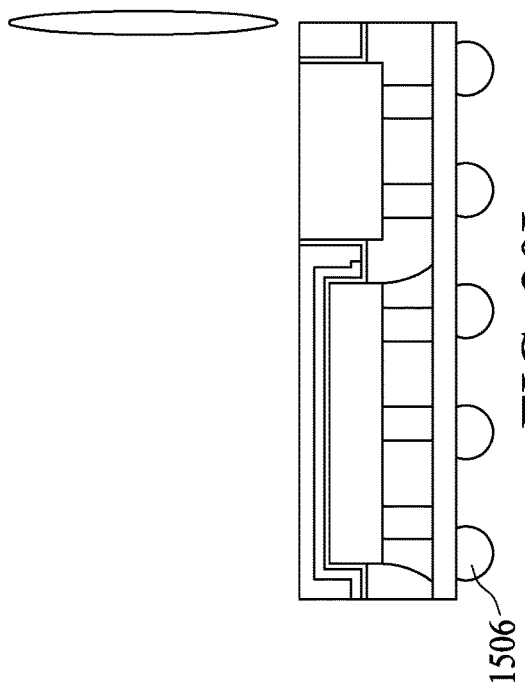

Similar to FIG. 8I to FIG. 8K, FIG. 20J shows an optional grinding operation performed to expose the top surface 1503t' of the semiconductor die 1503B from the second portion 1507B of the encapsulant. In FIG. 20K and FIG. 20L, the carrier 500 is detached and conductive terminals 1506 mounted to the conductive trace layer 1501. The semiconductor package structure 1800 is then formed after die saw operations. In FIG. 20A to FIG. 20L, the conductive trace layer is formed prior to the die bonding, and is referred to as a chip last operation herein.

Figure 21:
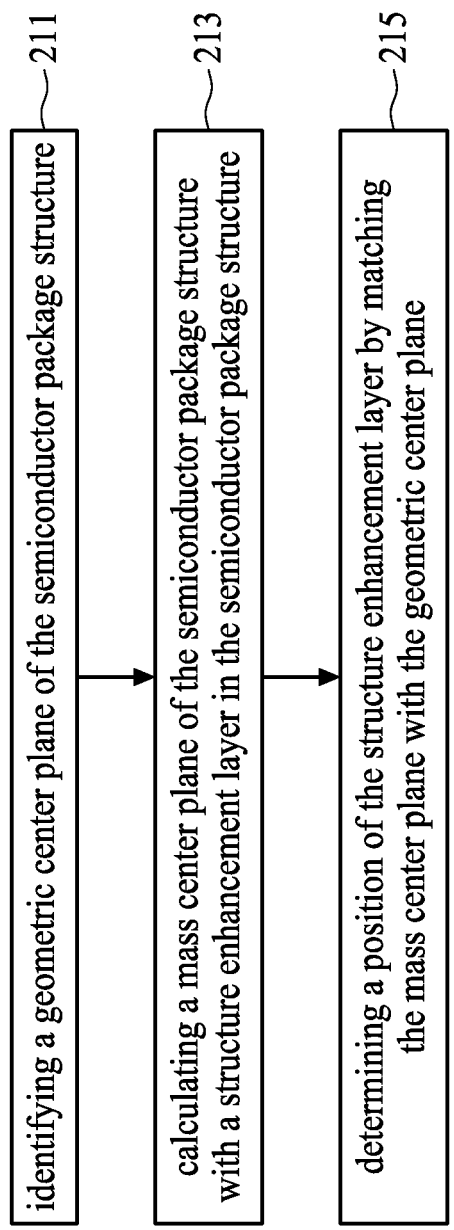
FIG. 21 is a flow chart for a method for manufacturing a semiconductor package structure, in accordance with some embodiments of the present disclosure.
Figure 23:
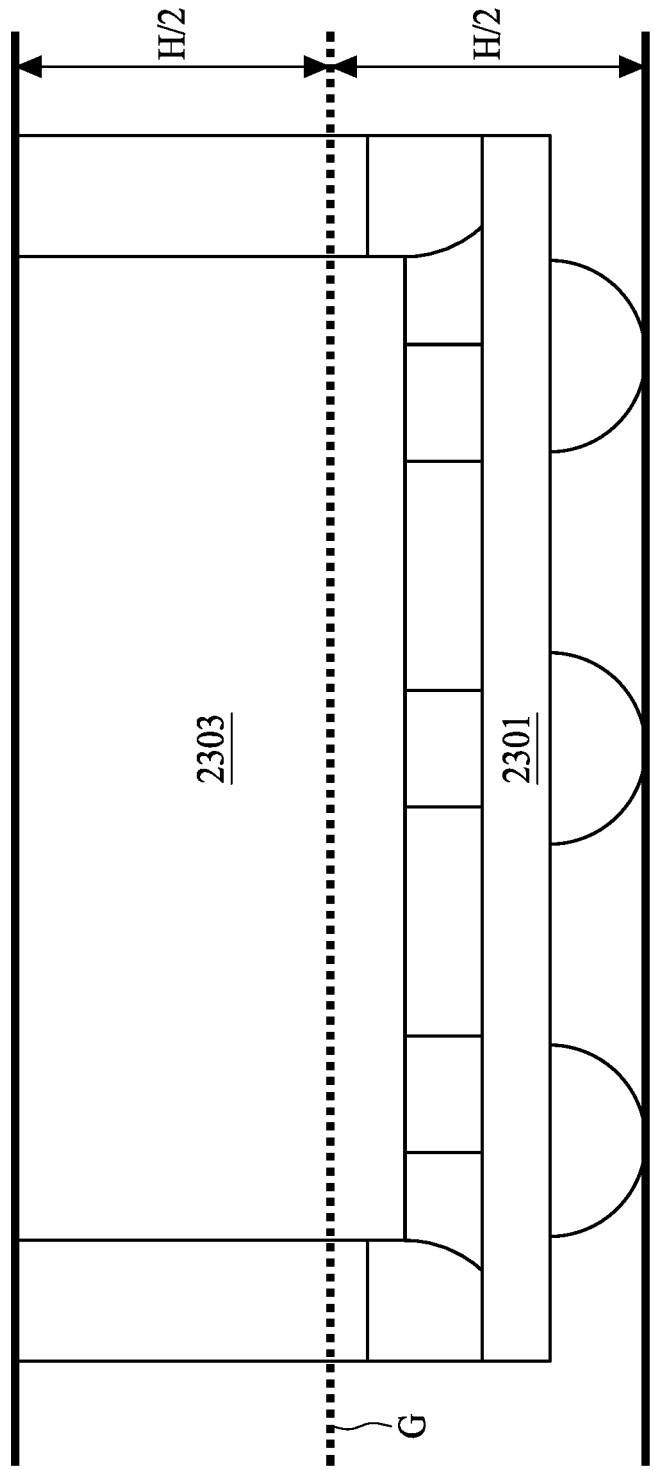

FIG. 21 is a flow chart for a method for manufacturing a semiconductor package structure, in accordance with some embodiments of the present disclosure. The method includes operation 211, identifying a geometric center plane of the semiconductor package structure. As shown in FIG. 23, which is a cross sectional view of a semiconductor package structure in some comparative embodiments of the present disclosure, the geometric center plane G can be determined to be at a half height H/2 of the semiconductor package structure.

Figure 22:
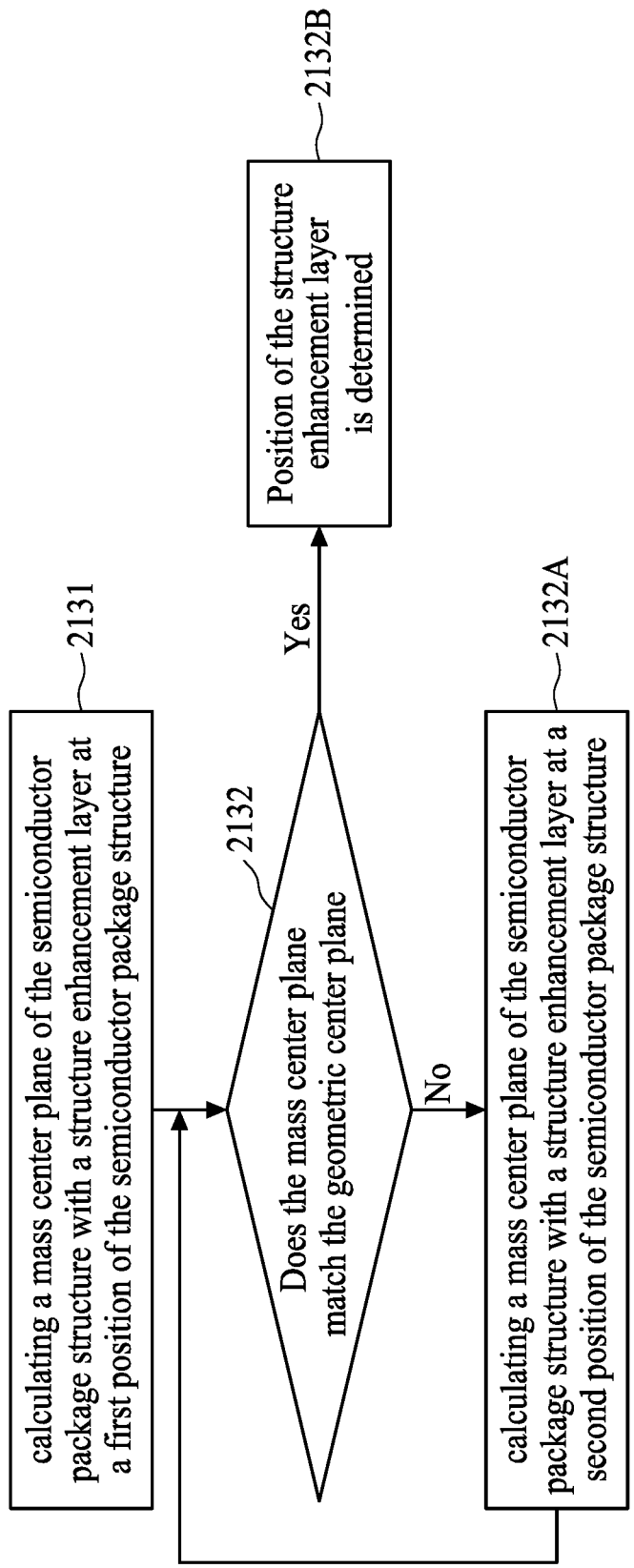
FIG. 22 is a flow chart for a method for manufacturing a semiconductor package structure, in accordance with some embodiments of the present disclosure.

The method also include operation 213, calculating a mass center plane of the semiconductor package structure with a structure enhancement layer in the semiconductor package structure. Referring to FIG. 22, which shows sub-operations for operation 213, and FIG. 24A, which is a cross sectional view of a semiconductor package structure in some comparative embodiments of the present disclosure, a mass center plane M is calculated based on a volume and density of each major components of the semiconductor package structure. Major components, for example, includes the semiconductor die 2403, the structure enhancement layer 2405A, the encapsulant 2407, the conductive bumps 2402, the underfill 2404, the conductive trace layer 2401, and the conductive terminal 2406. In the comparative example of FIG. 24A and operation 2131 of FIG. 22, the structure enhancement layer 2405A is positioned in a first position, or proximal to a top surface of the semiconductor die 2403, and as a result, the mass center plane M, after calculation, is at a level higher than the level of the geometric center plane G. Because the mass center plane M does not match with the geometric center plane G in FIG. 24A, according to operation 2132 and operation 2132A, the structure enhancement layer 2405A is determined not to be positioned at the first position previously used to calculate the mass center plane M. Instead, a second position, which is different from the first position, is used in the calculation of the mass center plane M to be the position where the structure enhancement layer is placed.

The method also include operation 215, determining a position of the structure enhancement layer by matching the mass center plane with the geometric center plane. Referring to operation 2132A and FIG. 24B, which is a cross sectional view of a semiconductor package structure in some embodiments of the present disclosure, the structure enhancement layer 2405B is positioned in the second position, or a position proximal to a bottom surface of the semiconductor die 2403. As a result, the mass center plane M, after calculation, is at a level that matches the level of the geometric center plane G. Because the mass center plane M matches with the geometric center plane G in FIG. 24B, according to operation 2132 and operation 2132B, the structure enhancement layer 2405B is determined to be positioned in the second location previously used to calculate the mass center plane M. The embodiment illustrated in FIG. 24B can better reduce the warpage problem compared to the comparative embodiment illustrated in FIG. 24A, as previously described herein.

Figure 25:
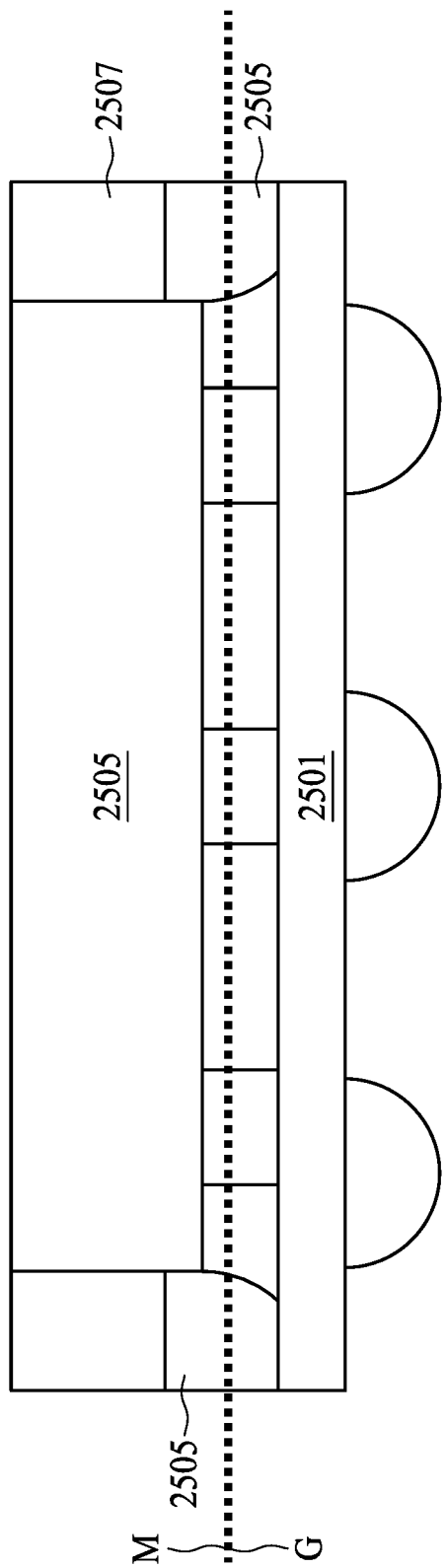

FIG. 25 also shows a semiconductor package structure having its geometric center plane G matching its mass center plane M. The structure enhancement layer 2505 is positioned at the corresponding mass center plane M. A bottom surface of the structure enhancement layer 2505 is in contact with the conductive trace layer 2501, and a top surface of the structure enhancement layer 2505 is in contact with the encapsulant 2507.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a conductive trace layer;
   a semiconductor die over the conductive trace layer;
   a structure enhancement layer surrounding the semiconductor die; and
   an encapsulant covering at least a portion of the semiconductor die and at least a portion of the structure enhancement layer, wherein the encapsulant comprises a first encapsulant under the structure enhancement layer and a second encapsulant over the structure enhancement layer;
   wherein a portion of the structure enhancement layer coincides with a mass center plane of the semiconductor package structure, the mass center plane being parallel to a top surface of the semiconductor die, and wherein the mass center plane is calculated based on a volume and density of the components between the semiconductor die and the conductive trace layer, the conductive trace layer, and conductive terminals mounted to the conductive trace layer.

2. The semiconductor package structure of claim 1, wherein the mass center plane of the semiconductor package structure coincides with a geometric center plane of the semiconductor package structure, the geometric center plane being parallel to the top surface of the semiconductor die.

3. The semiconductor package structure of claim 1, wherein a stiffness of the structure enhancement layer is greater than a stiffness of the conductive trace layer.

4. The semiconductor package structure of claim 1, wherein the conductive trace layer is a redistribution layer.

5. The semiconductor package structure of claim 1, wherein a top surface of the structure enhancement layer is lower than the top surface of the semiconductor die.

6. The semiconductor package structure of claim 1, wherein a sidewall of the semiconductor die and a sidewall of the structure enhancement layer are spaced by the encapsulant.

7. The semiconductor package structure of claim 1, wherein the first encapsulant is disposed below the mass center plane of the semiconductor package structure.

8. The semiconductor package structure of claim 1, wherein the first encapsulant comprises a plurality of heat conducting fillers and connects to the second encapsulant at a first interface, wherein the heat conducting filler that is proximal to the first interface is intact in shape.

9. A semiconductor package structure, comprising:
   a conductive trace layer;
   a first semiconductor die electrically coupled to the conductive trace layer;
   a first structure enhancement layer surrounding a sidewall of the first semiconductor die; and
   an encapsulant covering at least a portion of the first semiconductor die and at least a portion of the first structure enhancement layer,
   wherein a top surface of the first semiconductor die is exposed from the encapsulant, and wherein the encapsulant comprises a first encapsulant under the first structure enhancement layer and a second encapsulant over the first structure enhancement layer.

10. The semiconductor package structure of claim 9, further comprising:
   a second semiconductor die electrically coupled to the conductive trace layer;
   a second structure enhancement layer surrounding the second semiconductor die; and
   the encapsulant covering at least a portion of the second semiconductor die and at least a portion of the second structure enhancement layer.

11. The semiconductor package structure of claim 9, wherein a portion of the first structure enhancement layer coincides with a first mass center plane of the semiconductor package structure in a first semiconductor die region, the first mass center plane being parallel to the top surface of the first semiconductor die, and wherein the first mass center plane is calculated based on a volume and density of the components between the first semiconductor die and the conductive trace layer, the conductive trace layer, and first conductive terminals mounted to the conductive trace layer in the first semiconductor die region.

12. The semiconductor package structure of claim 10, wherein the second structure enhancement layer coincides with a second mass center plane of the semiconductor package structure in a second semiconductor die region being parallel to the top surface of the second semiconductor die, and wherein the second mass center plane is calculated based on a volume and density of the components between the second semiconductor die and the conductive trace layer, the conductive trace layer, and second conductive terminals mounted to the conductive trace layer in the second semiconductor die region.

13. The semiconductor package structure of claim 10, wherein a thickness of the first semiconductor die is greater than a thickness of the second semiconductor die.

14. The semiconductor package structure of claim 13, wherein a thickness of the first structure enhancement layer is thinner than a thickness of the second structure enhancement layer.

15. The semiconductor package structure of claim 10, further comprising:
   a first encapsulant below the second structure enhancement layer; and
   a second encapsulant over the second structure enhancement layer.

16. The semiconductor package structure of claim 10, wherein the first structure enhancement layer comprises a seed layer and a plated metal layer at the sidewall and a top surface of the first semiconductor die.

17. The semiconductor package structure of claim 16, wherein the second structure enhancement layer comprises a seed layer at the sidewall of the second semiconductor die.

18. The semiconductor package structure of claim 15, wherein the first encapsulant is disposed below a first mass center plane of the semiconductor package structure in a first semiconductor die region, the first mass center plane being parallel to the top surface of the first semiconductor die, and wherein the first mass center plane is calculated based on a volume and density of the components between the first semiconductor die and the conductive trace layer, the conductive trace layer, and first conductive terminals mounted to the conductive trace layer in the first semiconductor die region.

19. The semiconductor package structure of claim 15, wherein the first encapsulant comprises a plurality of first heat conducting fillers, the second encapsulant comprises a plurality of second heat conducting fillers, and the first encapsulant and the second encapsulant connect at a first interface, wherein the first heat conducting filler that is proximal to the first interface is intact in shape and the second heat conducting filler that is proximal to a top surface of the second encapsulant has a cut-off feature.

* * * * *